(12) United States Patent
Udell et al.

(10) Patent No.: US 7,386,778 B2
(45) Date of Patent: Jun. 10, 2008

(54) METHODS FOR DISTRIBUTING PROGRAMS FOR GENERATING TEST DATA

(76) Inventors: Jon Udell, 2255 Tannler Dr., West Linn, OR (US) 97068; Chen Wang, 10921 SW. 111th Ave., Tigard, OR (US) 97223; Mark Kassab, 28911 SW. Cascade Loop, Wilsonville, OR (US) 97070; Janusz Rajski, 6502 Horton Rd., West Linn, OR (US) 97068

( * ) Notice: Subject to any disclaimer, the term of this patent is extended or adjusted under 35 U.S.C. 154(b) by 161 days.

(21) Appl. No.: 11/255,777

(22) Filed: Oct. 20, 2005

(65) Prior Publication Data
US 2007/0094556 A1    Apr. 26, 2007

(51) Int. Cl.
G01R 31/28    (2006.01)
(52) U.S. Cl. ................................... 714/738
(58) Field of Classification Search ............ 714/738
See application file for complete search history.

(56) References Cited

U.S. PATENT DOCUMENTS

| | | | |
|---|---|---|---|
| 5,684,808 A * | 11/1997 | Valind | 714/726 |
| 5,802,075 A | 9/1998 | Carpenter et al. | |
| 6,334,199 B1 | 12/2001 | Ono et al. | |
| 6,751,767 B1 | 6/2004 | Toumiya | |
| 6,766,473 B2 * | 7/2004 | Nozuyama | 714/33 |
| 6,782,515 B2 | 8/2004 | Scott et al. | |

* cited by examiner

*Primary Examiner*—James C. Kerveros
(74) *Attorney, Agent, or Firm*—Klarquist Sparkman LLP

(57) ABSTRACT

Described herein are methods and systems for distributed execution of circuit testing algorithms, or portions thereof. Distributed processing can result in faster processing. Algorithms or portions of algorithms that are independent from each other can be executed in a non-sequential manner (e.g., parallel) over a network of plurality of processors. The network includes a controlling processor that can allocate tasks to other processors and conduct the execution of some tasks on its own. Dependent algorithms, or portions thereof, can be performed on the controlling processor or one of the controlled processors in a sequential manner.

39 Claims, 14 Drawing Sheets

|  | TARGET FAULTS | | | |
|---|---|---|---|---|
| 1115~ TASK 1 | 1 | 4 | 7 | ← 1100 |
| 1120~ TASK 2 | 2 | 5 | 8 | |
| 1125~ TASK 3 | 3 | 6 | 9 | |

FIG. 11A

|  | TARGET FAULTS | | | | | | | | 1140 |
|---|---|---|---|---|---|---|---|---|---|
| 1115~TASK 1 | 1 | 4 | 7 | 10 | 2 | 5 | 8 | 11 | |
| 1120~TASK 2 | 2 | 5 | 8 | 11 | 3 | 6 | 9 | 12 | |
| 1125~TASK 3 | 3 | 6 | 9 | 12 | 1 | 4 | 7 | 10 | |

| EMPTY QUEUE SLOTS ||| TASK ASSIGNED TO |
|---|---|---|---|
| $Q_1$ | $Q_2$ | $Q_3$ | |
| 4 | 6 | 3 | Q2 |
| 4 | 5 | 3 | Q2 |
| 4 | 4 | 3 | Q1 |
| 3 | 4 | 3 | Q2 |
| 3 | 3 | 3 | Q1 |
| 2 | 3 | 3 | Q2 |
| 2 | 2 | 3 | Q3 |
| 2 | 2 | 2 | Q1 |
| 1 | 2 | 2 | Q2 |
| 1 | 1 | 2 | Q3 |
| 1 | 1 | 1 | Q1 |

FIG. 13

METHODS FOR DISTRIBUTING PROGRAMS FOR GENERATING TEST DATA

TECHNICAL FIELD

This field relates generally to testing integrated circuits. More particularly, the field relates to distribution of testing of integrated circuits.

BACKGROUND

As integrated circuits are produced with greater and greater levels of circuit density, efficient testing schemes that guarantee high fault coverage while minimizing test costs and chip area overhead have become essential. The number of transistors that can be placed on a chip has been doubling roughly every eighteen months, as predicted by Moore's law. The amount of data required to test such massively complex chips has been increasing even more rapidly. In practical terms, for very large integrated circuits, the test cost is approaching (and may even exceed) the design cost.

Various algorithms that employ various schemes related to testing are implemented as software code within testing software. These include such algorithms as those related to automated test pattern generation and fault simulation, for instance. Improving the speed of performance of such algorithms can help reduce costs and time associated with preparing to test a circuit.

Some of the automated circuit testing algorithms relate to various schemes for generating test patterns. A test pattern comprises a set of specified values for a circuit's inputs and scan elements that is created to detect one or more faults of the circuit and possibly satisfying one or more sets of constraints on the values of the circuit. It may specify values for a subset of the inputs and scan elements (e.g., a test cube) or all of them (possibly a test cube with pattern fill). It may also optionally include information about expected circuit output and scan element values.

Automatic test pattern generation (ATPG) is typically performed in the following manner. To generate a test pattern to be included in a test set, one or more faults related to the circuit under test (CUT) from a list of targeted faults are selected and a test pattern configured to detect the targeted faults is computed. The deterministic test values in the test pattern comprise values generated to provoke the targeted faults and cause their effects to be propagated to a point where they can be observed. These deterministic test patterns are sometimes referred to as "test cubes." Typically, the deterministic test values comprise only a small portion of the test values in a test pattern. In some cases, for example, only 1% to 5% of the values in a test pattern are deterministic values for testing targeted faults. The remaining, unspecified values are typically filled with randomly selected values as pattern fill used to fully specify the test pattern for fault simulation and other forms of testing. In some cases, instead of random values, constant "0"s or "1"s are chosen. In still other cases, values that minimize power dissipation are used. Fault simulation is then performed to determine which of the faults are detected and can be dropped from further consideration (e.g., removed from the list of targeted faults). This procedure is iterated until all faults have been targeted and detected.

In test environments that use encoding or other methods of data compression to reduce test data volume (such as embedded deterministic test), the unspecified values in a test pattern can also be randomly filled by a decompressor during the process of test loading the test stimuli. The fully specified pattern resulting from decompression can be simulated during test pattern generation in order to determine what faults are detected by the test pattern and can be dropped from the list of targeted faults.

In random test pattern generation, random patterns are created and simulated to determine which faults they detect, with additional patterns being generated until either a desired test coverage is reached or it appears that the possible benefits of the additional coverage is outweighed by the effort required to achieve it. In deterministic test pattern generation one or more specific faults are targeted. First, the conditions necessary to cause those faults to affect the circuit are determined (referred to as fault excitation), and a search algorithm is employed to deterministically justify those conditions while propagating the effects of the fault to an observation point such as a circuit output or a scan cell (fault propagation). These two techniques are often combined in various ways, for example by using random test generation to limit the number of faults that need to be targeted deterministically, or by filling in unspecified portions of deterministically generated patterns with random values (e.g., by pattern fill)

Test pattern generation algorithms are often accessed based on three properties. First, the overall fault coverage achieved, (e.g., measured as a percentage of modeled faults that the patterns will detect). Second, the number of test patterns generated (pattern count); and third, the time required to generate the patterns. High fault coverage is important as a measure of the benefit of applying the patterns to a device since the higher the coverage of the faults being targeted the more likely the patterns are to be able to detect a corresponding manufacturing defect in the device.

Low pattern count is important for keeping the cost of applying the patterns to the devices low. Many methods are used to reduce the number of patterns generated by test pattern generation algorithms. For instance, simulation-based compaction can be used to determine which faults are detected by test patterns, allowing a minimal set of test patterns to be chosen to cover all the faults. Trade offs such as sacrificing fault coverage for lower pattern count can be made, if desired, by eliminating patterns that do not contribute much additional fault coverage. In practice, this can be quite computationally expensive. It is more common to simulate the generated patterns in different orders, often including reverse order, eliminating patterns that only detect faults already detected by patterns already simulated.

Another effective method of reducing the overall pattern count is via dynamic test compaction within the algorithm itself. In dynamic test compaction, one or more faults are targeted deterministically by the test pattern generation algorithm, then the resulting partially specified pattern is enhanced by targeting additional faults incrementally subject to the restrictions already determined to be necessary to detect the previous faults. If the test pattern generation algorithm is successful at detecting the incrementally targeted fault or faults, then the enhanced test pattern is used as a starting point for incrementally targeting even more faults, until some stopping threshold condition is reached. If the algorithm is unsuccessful, then the original pattern is reused as a starting point for targeting other faults, again until some stopping point is reached. In this manner, each generated pattern targets multiple faults, and thus, reduces the overall pattern count.

It should be noted that incrementally targeting faults subject to previously imposed constraints can reduce the overall search space for a successful test. This can result in reduced computational effort while also reducing the probability of success. Hence, it is may be necessary to incrementally target a given fault a number of times before a successful result is obtained. Furthermore, pattern count (and computational efficiency) can also be further improved by not targeting faults already detected by previously generated patterns, and by not incrementally targeting faults already detected by any current partially specified test pattern. Ideally, this would involve simulating each partially specified pattern against the entire fault list to drop detected faults from consideration, but this is not practical computationally. At best it is practical to simulate on a per-pattern basis. In fact, many testing algorithms incorporate simulation techniques that are more efficient simulating multiple patterns at once (e.g., 32 or 64 at a time).

So instead of simulating each pattern individually to drop faults from consideration, simulation may occur less frequently, and patterns or partial patterns are generated in many cases that are not needed. This increases the overall test pattern generation computational effort and pattern count in favor of overall efficiency. Testing algorithms attempt to limit this redundant overlap of patterns by targeting faults using an ordering based partially on random number generators, either when creating the initial partial pattern and/or during subsequent targeting, which reduces the chances of generating patterns that target similar faults. These random number generators can be pseudo random number generators. The random number generators used deterministically generate random number sequences that can be repeated if desired by setting the seed (i.e. the state) of the generator to a specific value.

The time required to generate the patterns is important both in terms of the cost of generating the patterns and in terms of reducing the time required to get a device to market. Shortening the time can also allow more experimentation with other parameters of a device to occur, allowing improved device quality or functionality in a fixed development schedule. This applies in general to circuit testing algorithms that include not only test pattern generation algorithms but other algorithms related to such circuit testing activities as fault simulation, and test pattern compaction. As noted above, executing these various testing algorithms is complex and computationally time consuming at least in part because of the complex schemes involved in these algorithms. One way to reduce the time associated with test pattern generation is by employing multiple computer processors (on one or more host computers) to perform algorithms associated with test pattern generation.

SUMMARY

Described herein are methods and systems for distributed execution of circuit testing algorithms, or portions thereof. In one aspect, portions of circuit testing algorithms that are independent from each other are executed in a non-sequential manner over a plurality of processors. The independent portions are those portions of the algorithm that do not depend upon results from execution of other portion of the algorithm. In another aspect, the non-independent portions are performed sequentially. In a further aspect, the execution of circuit testing algorithms, or portions thereof, result in generating one or more test patterns, or a test response from a fault simulation of the circuit under test.

In a further aspect, regardless of the order of execution of the various portions of the algorithm, the results from such execution are processed in the order they would have been processed if the independent and non-independent portions of the at least one circuit testing algorithm were performed sequentially. In another aspect, at least some independent algorithm portions are performed in parallel with each other over a plurality of controlled processors, which provide the results of their processing to a controlling processor. In yet another aspect, the controlling processor performs one or more of non-independent portions of the algorithm. Also, the controlling processor is capable of processing one or more independent portions non-sequentially. The controlled processors are also capable of performing one or more non-independent portions sequentially. In another aspect, independent portions allocated to be performed on one or more controlled processors target different faults related to a circuit under test. In one more aspect, independent algorithms related to test pattern generation between simulations are executed in parallel.

In yet another aspect, results from execution of independent algorithm portions are processed in a pre-determined order regardless of the order of their execution. In a further aspect, the pre-determined order of processing results is used regardless of whether the independent portions were executed by the controlled processor or controlling processor. Results found not to be needed can be discarded. For instance, portions of algorithms that detect faults already found to have been detected by previous simulation calls can be discarded. In a further aspect, the order of processing results is based at least in part on the order of execution of the corresponding algorithm portions. Also, a basic order for processing results from execution of algorithm portions can be used at least in part to determine an order for executing the associated algorithm portions. In one aspect, the basic order comprises the order in which faults are targeted.

In one other aspect, a plurality of circuit testing algorithms is performed with independent algorithms, or portions thereof, being performed in a non-sequential manner. In a further aspect, the results of such execution can be processed in a pre-determined order regardless of the order of execution.

In yet another aspect, an algorithm can be modified to create a rolling window of a plurality of tasks to allow for execution of the tasks in the rolling window in a non-sequential manner. The rolling window can be shifted to progress further along the sequence of tasks. In a further aspect, where there are a plurality of simulation calls, the rolling windows are reconfigured between simulation calls. In another aspect, the results of independent tasks in a rolling window can be used by tasks outside the window. Also, the order of processing results from the tasks in the rolling window is independent of the order of execution of the tasks. For instance, the order of processing the results can proceed according to a pre-determined order.

Additional features and advantages will become apparent from the following detailed description of illustrated embodiments, which proceeds with reference to accompanying drawings.

BRIEF DESCRIPTION OF THE FIGURES

FIG. 11A is a block diagram illustrating an exemplary configuration for distributed processing of tasks wherein tasks that target a non-overlapping set of faults are allocated to different processors to be executed in parallel.

FIG. 11B is a block diagram illustrating an exemplary configuration for distributed processing of tasks wherein different processors execute tasks targeting an initially non-overlapping set of faults with overlaps occurring later in the execution queue.

FIG. 13 is a block diagram illustrating an exemplary scheme for allocating tasks for execution between an exemplary set of execution queues of processors based at least in part on the number of available slots in the queue.

DETAILED DESCRIPTION

Figure 1:
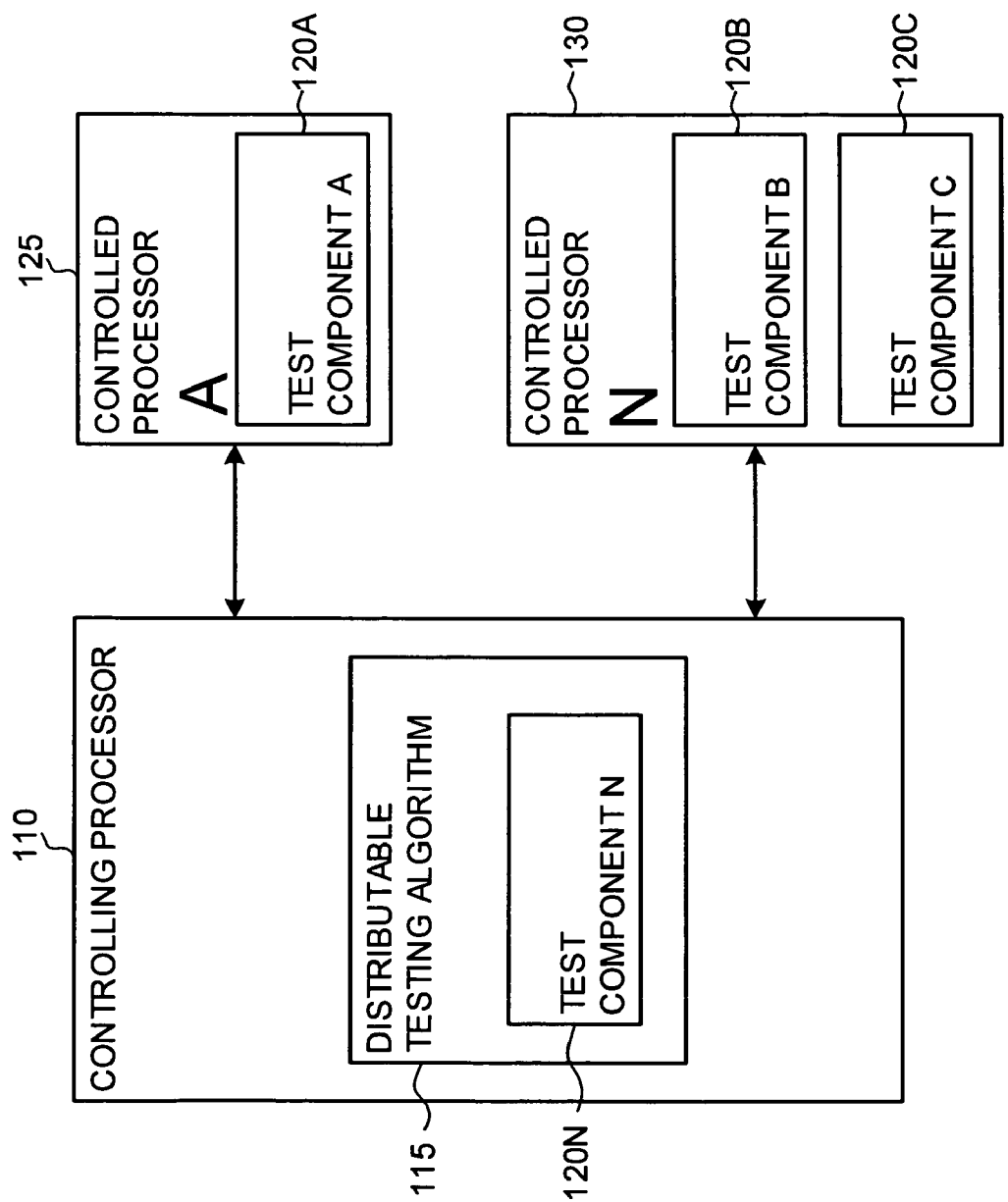
FIG. 1 is a block diagram illustrating an exemplary system for distributable execution of circuit testing algorithms or portions thereof.

As used herein and in the claims, the singular forms "a", "an", and "the" include the plural forms unless the context clearly dictates otherwise. For instance, the term "a" includes one or more. If there are two components "x", then there exists a component "x". Additionally, the term "includes" means "comprises".

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "generate" and "determine" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be used for testing a wide variety of circuits (e.g., application-specific integrated circuits (ASICs) (including mixed-signal ASICs), systems-on-a-chip (SoCs), or programmable logic devices (PLDs), such as field programmable gate arrays (FPGAs)). Any of the methods or techniques described herein can be performed using software that comprises computer-executable instructions stored on one or more computer-readable media. Such software can comprise, for example, an electronic-design-automation (EDA) software tool, such as an automatic test pattern generation (ATPG) tool. Any such software can be executed on a single computer or on a networked computer system (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

The disclosed methods can be stored on one or more tangible computer-readable media and such media are considered to be within the scope of this disclosure. Computer-readable media storing such testing methods and results thereof (e.g., test patterns and results of fault simulation) may be accessed and used by a single computer, networked computer (such as those described above), or dedicated testing system (e.g., automatic testing equipment (ATE)).

Any of the disclosed methods and systems can be used to test physically existing circuit designs or for representations of circuit designs stored on one or more computer-readable media. For example, the disclosed methods may use circuit design information (e.g., a netlist, HDL file (such as a Verilog or VHDL file), or GDSII file) stored on computer-readable media during test pattern generation.

Certain aspects of the disclosed technology involve storing or retrieving data from one or more lists. As used herein, the term "list" refers to a collection or arrangement of data that is usable by a computer. A list may be, for example, a data structure or combination of data structures (such as a queue, stack, array, linked list, heap, or tree) that organizes data for better processing efficiency, or any other structured logical or physical representation of data in a computer system or computer-readable media (such as a table used in a relational database). Moreover, any of the lists discussed herein may be persistent (that is, the list may be stored in computer-readable media such that it is available beyond the execution of the application creating and using the list) or non-persistent (that is, the list may be only temporarily stored in computer-readable media such that it is cleared when the application creating and using the list is closed or when the list is no longer needed by the application).

Exemplary Distributed Processing of Testing Algorithms

One way to speed up execution of automated circuit testing algorithms is to divide portions of an algorithm to be distributed for execution in parallel (e.g., non-sequentially) on multiple processors, and then to combine the results from the separate processors back together. Such distributed processing is also applicable to sets of algorithms. In one embodiment, dependencies between the various algorithms or portions thereof being distributed have to be considered in how the execution is allocated. Thus, algorithms or portions thereof that are independent from each other can desirably be allocated to be executed on different processors.

A first circuit testing algorithm is independent from a second circuit testing algorithm if it does not depend upon results from the performance of the second circuit testing algorithm. Conversely, non-independent circuit testing algorithms are those that depend upon the results from performing at least one other circuit testing algorithm. Non-sequential execution encompasses distributed parallel processing by a combination of processors wherein execution of some of the distributed algorithms or portions thereof can be overlapping in time and/or some can even be in a sequential order in time.

Such distribution can be performed at various levels of granularity. For instance, if there are a number of circuit testing algorithms used for testing a circuit, then each algorithm or some combination of algorithms can also be performed on multiple processors. Furthermore, the same algorithm can be called on multiple times and as such the different call instances of the same algorithm too can be executed in a distributed manner.

FIG. 1 illustrates a system capable of processing automated testing algorithms in a distributed manner. In distributed processing, typically there is a controlling processor 110 executing a controlling process that controls the overall allocation of one or more components (e.g., 120A-C) of distributable testing algorithm 115 to be executed or performed on controlled processors (e.g., 125 and 130). The controlling processor 110 can also assign itself the task of performing some algorithms or portions thereof (e.g., 120N). The controlling processor can distribute the work to the controlled processors (e.g., 125 and 130) and integrate the results with any processing that it may perform on its own. ///Alternatively, one more controlled processors (e.g., 125 and 130) can integrate the results. In this manner, computation related to performance of various portions of the overall algorithm 115 can be performed in parallel resulting in reduced times for executing circuit testing algorithms.

In general, whatever is executing the controlling process is the controlling processor and controlling process can be switched to another processor on the same host. In addition, a hierarchy of controlling processors can implement the functionality described herein with reference to a single controlling processor. Furthermore, a plurality of controlled processors can be associated with a single host. Also, the controlling processor and one or more of the controlled processors can be within the same host.

Distribution of processing related to automated testing can occur at many levels and in many different forms. For example, in case of test pattern generation algorithms one method would be to partition the circuit under test at the start of test pattern generation and to assign each partition to a processor. The resulting patterns generated for the partitions could then be combined together again to create the final test patterns. Distribution in this manner may cause end results to be different from the scenario of performing the algorithm or collection of algorithms in a non-distributed manner (e.g., being performed in a sequential manner by a single processor). The same may hold true, based on number of processors used for distribution, or potentially, there may be variances in distributed results with a fixed number of processors. Such inconsistencies in results due to distribution is less desirable to a user of testing software because the user will never know whether or not better results could have been achieved with a different scheme of distribution or even between rerunning the testing program with the same distribution scheme.

Thus, there is a need for achieving consistency in the results obtained from the performance of an algorithm or a collection of algorithms regardless of whether the performance was in a distributed and non-distributed manner. The need for obtaining such consistency suggests distributing test pattern generation algorithms, for instance, at lower granularity levels. However this is can be difficult due to the highly sequential nature of many testing algorithms. For example, most non-distributed testing algorithms start by performing some initial computations, then go into a loop consisting of alternating test pattern generation steps to generate patterns, and fault simulation steps to drop detected faults from consideration. These simulation steps become synchronization points affecting future test pattern generation steps by altering the known set of faults remaining to be targeted. During test pattern generation, each pattern also becomes a synchronization point in that the faults that were successfully targeted while generating the pattern are known, eliminating the need to target those faults in subsequent patterns generated prior to the next simulation step. Information about unsuccessfully targeted faults is also often used to influence the targeting performed in subsequent pattern generation attempts.

Furthermore, due to the large search spaces involved, testing algorithms often make use of heuristics involving random number generators. These heuristics, combined with other uses of random numbers such as filling in unspecified bits of partial patterns (pattern fill), result in another form of sequentiality that can cause even a minor change in one portion of the algorithm to have effects on the random sequences used in other portions of the algorithm and hence on the final results. Such dependencies in random number generation between the performance of a number of testing algorithms or different call instances thereof affects the final combined results as well. In a distributed test pattern generation algorithm, for instance, non-distributed synchronization points can be used as natural points to synchronize the distributed processing as well. However, having too many synchronization points can reduce the parallelism that may be achieved by distributed processing, whereas eliminating natural synchronization points can alter results obtained from distributed processing from the non-distributed processing unless care is taken in the implementation to avoid this problem.

Exemplary Circuit Testing Algorithms

Test pattern generation algorithms relate to various schemes for generating test patterns that comprise a set of specified values for a circuit's inputs and scan elements that are created to detect one or more faults of the circuit and possibly satisfying one or more sets of constraints on the values of the circuit. It may also specify values for a subset of the inputs and scan elements (e.g., a test cube) or all of them (possibly a test cube with pattern fill). It may also optionally include information about expected circuit output and scan element values.

Fault simulation comprises the acts of simulating what the circuit would do if a targeted fault was present to see if a test pattern detects the targeted fault. Fault simulation indicates the effectiveness of the test pattern generated. Execution of any of the circuit testing algorithms (e.g., related to test pattern generation and fault simulation) described above result in generation of test data, which comprises data relating to generating a test pattern or data relating to the effectiveness of patterns in targeting faults (e.g., through fault simulation).

Exemplary Methods of Generating Distributable Circuit Testing Algorithms that Can Yield Results Consistent with Performance of the Algorithms in a Non-Distributed Manner One method of creating testing algorithms that are distributable and can yield results when performed in a distributed manner that are consistent with results when performed in a non-distributed manner is by isolating random number generation associated with the algorithms or portions thereof that can be performed independently of each other. For instance, there are cases where proper execution of individual algorithms or portions thereof depends on the results of random numbers generated for use by other algorithms or other algorithm portions. One method to make such algorithms or portions thereof distributable yet consistent is to isolate the process of generating random numbers used by the various algorithms from each other such that the use of random number generation during one application (e.g., by one call instance) of an algorithm does not affect the generation of random numbers used in another algorithm. For example, in this manner a pattern fill algorithm or a portion thereof can be executed independently of the test pattern generation (ATPG) associated therewith. The pattern fill algorithm can use one random sequence, while test pattern generation algorithm can use another. This allows for obtaining repeatable and consistent results from performance of each of these algorithms that are independent of any changes to the other algorithm and the manner in which the algorithms are executed (e.g., in a distributed manner or a non-distributed manner).

Furthermore, in some cases, the random number sequence used by one call to an algorithm is simply continued in a subsequent call to that algorithm. However, during distribution it is advantageous to be able to alter calling sequences, changing their order, and/or distributing different calls to different processors. To ensure consistency of results when a given algorithm is run multiple times in different orders, individual algorithms dependant on the results of random number generators are isolated from each other such that the use of random number generation during one application of an algorithm does not affect the generation of random numbers used in another application of that algorithm.

Figure 2:
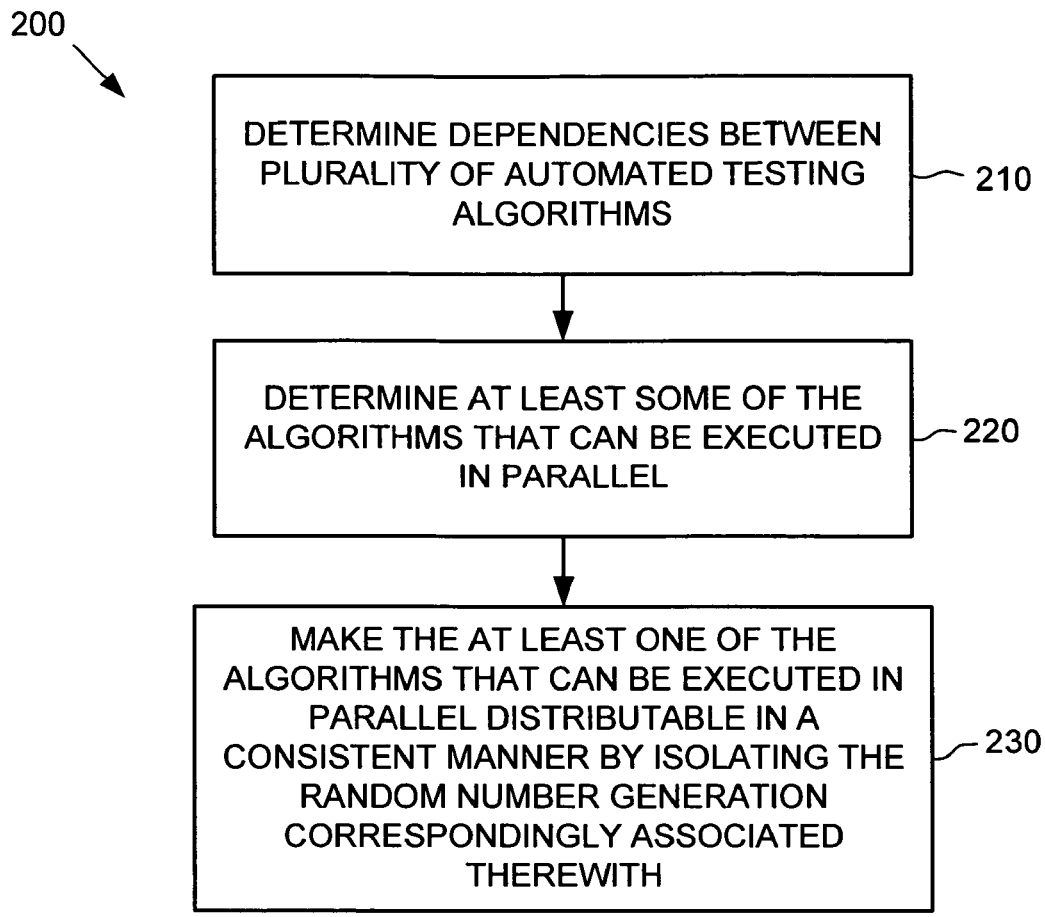
FIG. 2 is a flow diagram describing exemplary methods of making circuit testing algorithms or portions thereof distributable.

FIG. 2 illustrates an exemplary method 200 of creating testing algorithms that are distributable and yet can still yield results when performed in a distributed manner that are consistent with results when performed in a non-distributed manner. At 210, dependencies between a plurality of testing algorithms are determined. At 220, at least a plurality of testing algorithms that can be performed independently of each other are identified. A first circuit testing algorithm is independent from a second circuit testing algorithm if it does not depend upon results from the performance of the second circuit testing algorithm. Conversely, non-independent circuit testing algorithms are those that depend upon the results from performing at least one other circuit testing algorithm. The results here refer to any output of the algorithms, but do not refer to states of random number generators associated therewith. However, even if a plurality of algorithms are independent from each other and, thus, acceptable for distributed performance, in order to ensure consistency of results between a distributed performance and non-distributed performance, at 230, any random number generation associated with performing these algorithms will be isolated from each other.

Figure 3:
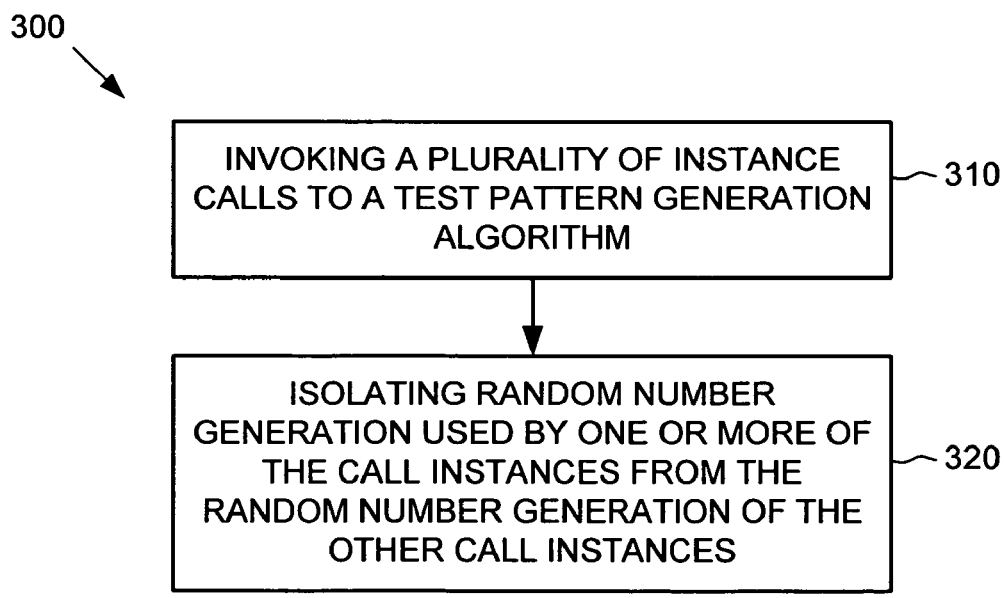
FIG. 3 is a flow diagram describing exemplary methods of making different call instances to the same algorithm or portions thereof distributable.

As noted above the same algorithm can be called multiple times as part of an overall testing algorithm. Such individual call instances of algorithms potentially can run multiple times in different orders but might rely on the same random number sequence. However, these separate call instances may otherwise be independent of each other. These separate call instances of the same algorithm can be made distributable yet able to yield results consistent with their performance in a non-distributed manner. FIG. 3 illustrates one such method 300. At 310, when a plurality of calls to a testing algorithm are invoked, at 320, at least some of this plurality of call instances can be made distributable by isolating any random number generation associated with executing these call instances.

Exemplary Methods of Ensuring Isolation of Random Number Sequence Generation

One way to isolate random number generation is to base the computation of random number sequences associated with each call instance related to of the same algorithm at least in part on invariant data associated with the call instance. Here, the invariant data is invariant, with respect to that specific call instance and can vary between different calls. For instance, this includes computing the random number sequence based at least in part on the calling parameters used for the particular call instance. In this manner, different calls to these algorithms will use different random number sequences because these sequences are independent of random number sequences related to other calls to the algorithm or calls to other algorithms that have different call parameters. The same principle can be applied to isolate random number generation used by calls to different algorithms. Applying the principles above to a specific situation, for instance, the random sequence(s) used during test pattern generation for a given fault can be computed based on the properties of the fault itself, thus making it independent of the random number generation used for previous calls to the same algorithm for other faults.

However, in some instances it may be desirable to repeat a call to an algorithm with the same set of parameter data, but still have the need to use a different random sequence than before. In such a case, random sequence computations are modified deterministically. For instance, applying this technique specifically to the fault excitation and propagation steps of deterministic test pattern generation algorithms or portions thereof, subsequent calls to algorithms used for test generation that are intended to use different random sequences can compute these different random sequences deterministically rather than repeating or continuing the previous random sequence. An example deterministic random sequence generation would be to simply pass another parameter indicating which sequence is desired, and to use that parameter in the calculation of the sequence. Another method would be to suggest changes in the random number sequence to the controlled processors at various points in time, such as sending a variable to the controlled processors that they can then use in the computation of the random number sequence.

Figure 4A:
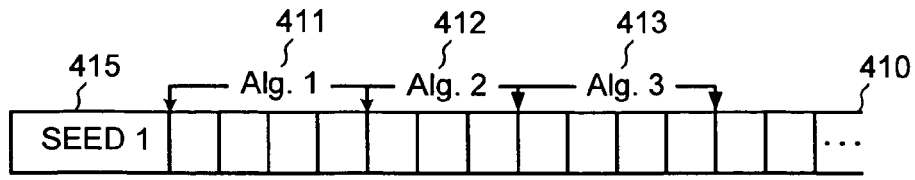
FIG. 4A is a block diagram illustrating exemplary random number generation associated with execution of a plurality of circuit testing algorithms in a sequential manner.

Isolating the random number generation used by different algorithms or different call instances of the same algorithm does not necessarily mean that different random number generators need to be used for different algorithms or different call instances of the same algorithm. Isolation can also be achieved by reseeding a shared generator with a new value, and possibly restoring the old seed value when done. For instance, FIG. 4A illustrates a random number sequence 410 used by at least three different algorithms 411-413. In this case, the random number sequence is generated based on a single seed 415 and as such, the random number sequence used by algorithm Alg. 2 at 412 is dependent on random number sequence used by the previously executed algorithm Alg. 1 at 411. Likewise, the sequence used by algorithm Alg. 3 at 413 is dependent on the sequence used by both algorithms Alg. 1 at 411 and Alg. 2 at 412. In this configuration, distributed processing (e.g., in parallel on separate processors) of algorithms Alg. 1-3 at 411-413 cannot be guaranteed to yield results consistent with non-distributed performance of the same algorithms. However, as shown with reference to FIG. 4B, the random number sequences used by the different algorithms Alg. 1-3 at 411-413 can be made independent by having the corresponding sequence they use (e.g., 420 corresponding to 411, 430 corresponding to 412 and 440 corresponding to 413) be generated based on different known seeds (e.g., 415 with sequence 420, 425 with sequence 430 and 435 with sequence 440).

Figure 4B:
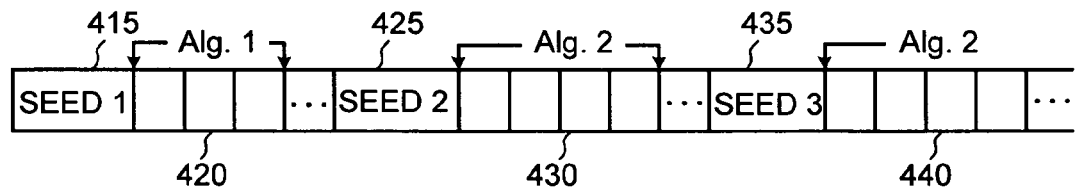
FIG. 4B is a block diagram illustrating exemplary random number generation associated with execution of a plurality of circuit testing algorithms wherein random number generation associated with each different algorithm is isolated from the random number generation associated with the others.
Figure 4C:
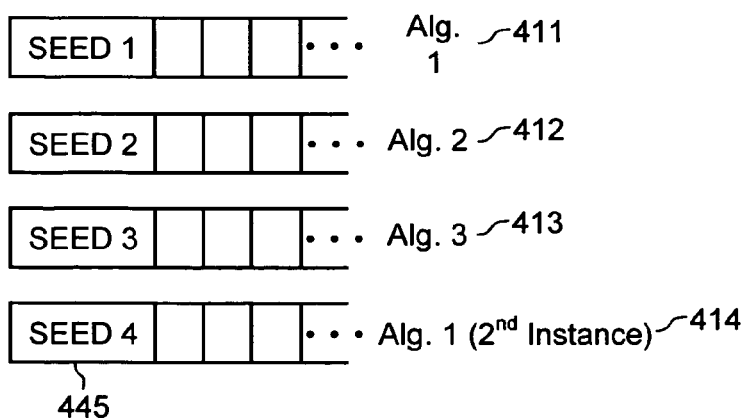
FIG. 4C is a block diagram illustrating exemplary distributed processing of algorithms and multiple call instances thereof made distributable by having their respective associated random number generation isolated from each other.

Although FIGS. 4A-B illustrate examples of reseeding as it relates to execution of different algorithms, the same principle in general may be applied to different call instances of the same algorithm or portions thereof. Also, since the seeds are independently chosen, the sequences may overlap whereby the sequence used by one algorithm may have some sequence numbers in common with the others. As a result of decoupling the random number sequences used by the various algorithms, the algorithms Alg. 1-3 at 411-413 can be run in distributed manner, if needed, as shown in FIG. 4C and still yield results that are consistent with a non-distributed execution of the same. A second call instance at 414 of the algorithm Alg. 1 is also shown in FIG. 4C to illustrate the fact that reseeding methods can be applied to isolate random number generation associated with the different call instances of the same algorithm.

Furthermore, the calculation of the independent seeds (e.g., 415, 425, 435, and 445) corresponding to different algorithms or different call instances of the same algorithms can be made based at least in part on invariant data, such as call parameter data, as described above. Likewise, the calculation of the independent seeds can also be made deterministic.

Exemplary Execution of Distributable Algorithms in a Distributed Manner

Figure 5:
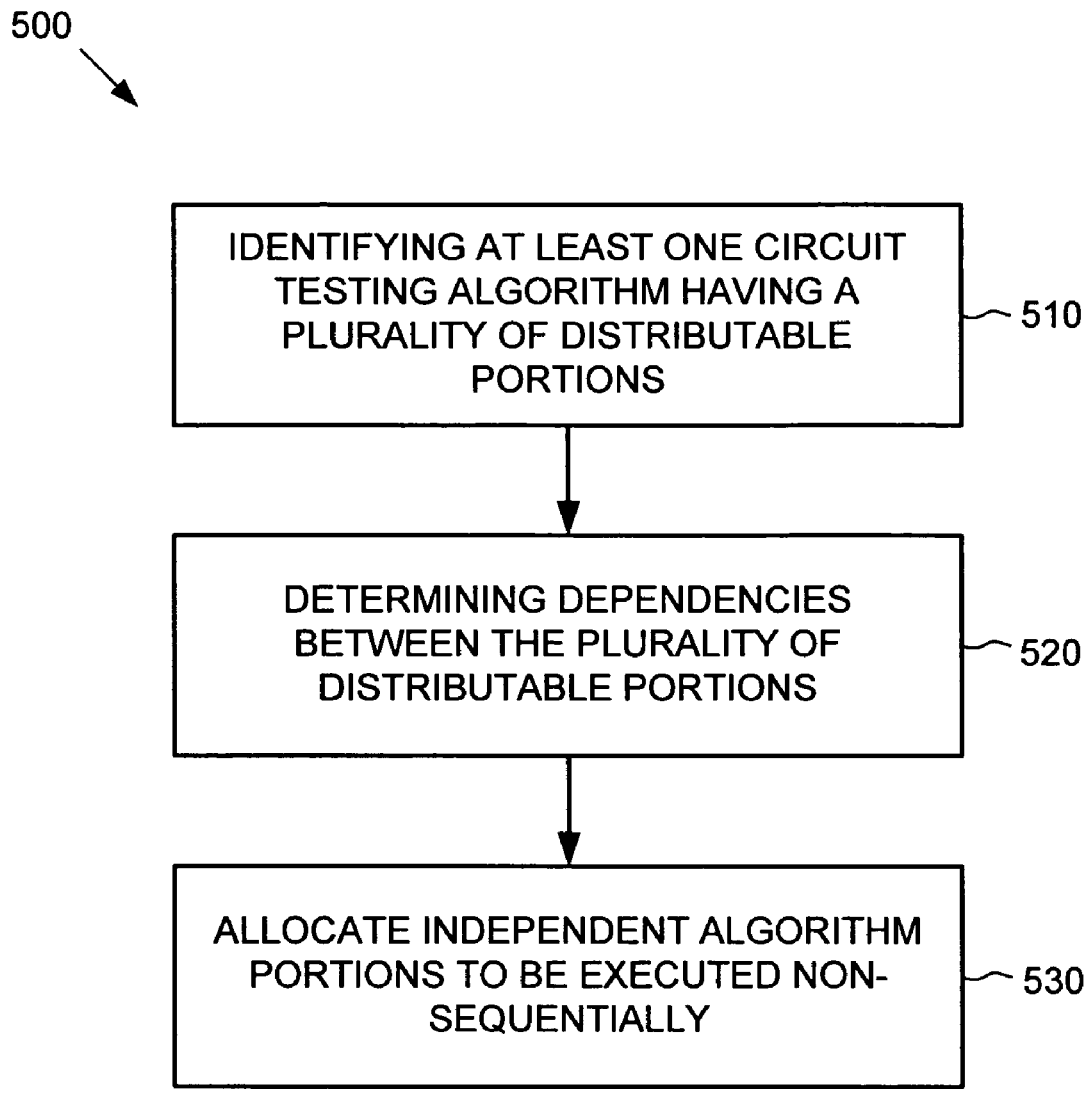
FIG. 5 is a flow diagram describing an exemplary method for conducting execution of distributable circuit testing algorithms or portions thereof in a distributed manner.

FIG. 5 illustrates an exemplary method 500 for allocating and executing distributable circuit testing algorithm in a distributed manner. At 510, at least one circuit testing algorithm is identified to be executed in a distributed manner and at 520, dependencies between portions of the identified algorithm are determined. As a result, those portions that can be executed or performed in an independent manner are identified at 530 and are allocated by the controlling processor (e.g., 110 of FIG. 1) to be executed by itself or one or more of the controlled processors (e.g., 120 and 130). Such allocation is applicable at the algorithm level and those algorithms that are independent from each other can be allocated to be executed in a distributed manner.

In one embodiment, the controlling processor (e.g., 110 of FIG. 1) can allocate one or more independent algorithms or portions thereof to be executed by itself and this can be in addition to any set of algorithms or portions thereof that are dependent on each other and thus, allocated to be executed in a non-distributed manner (e.g., sequentially). However, execution of a set of algorithms or portions thereof that are not independent from each other is not limited to be entirely allocated to the controlling processor. In fact, they can also be allocated to one or more controlled processors for execution.

Figure 6A:
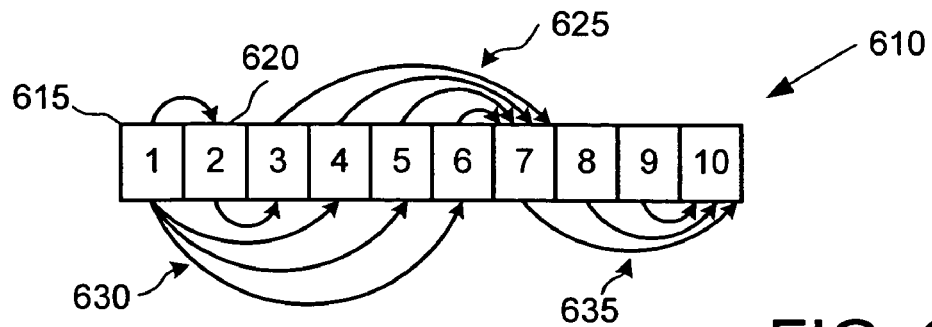
FIG. 6A is a block diagram illustrating exemplary dependencies between portions of an exemplary circuit testing algorithm.
Figure 6B:
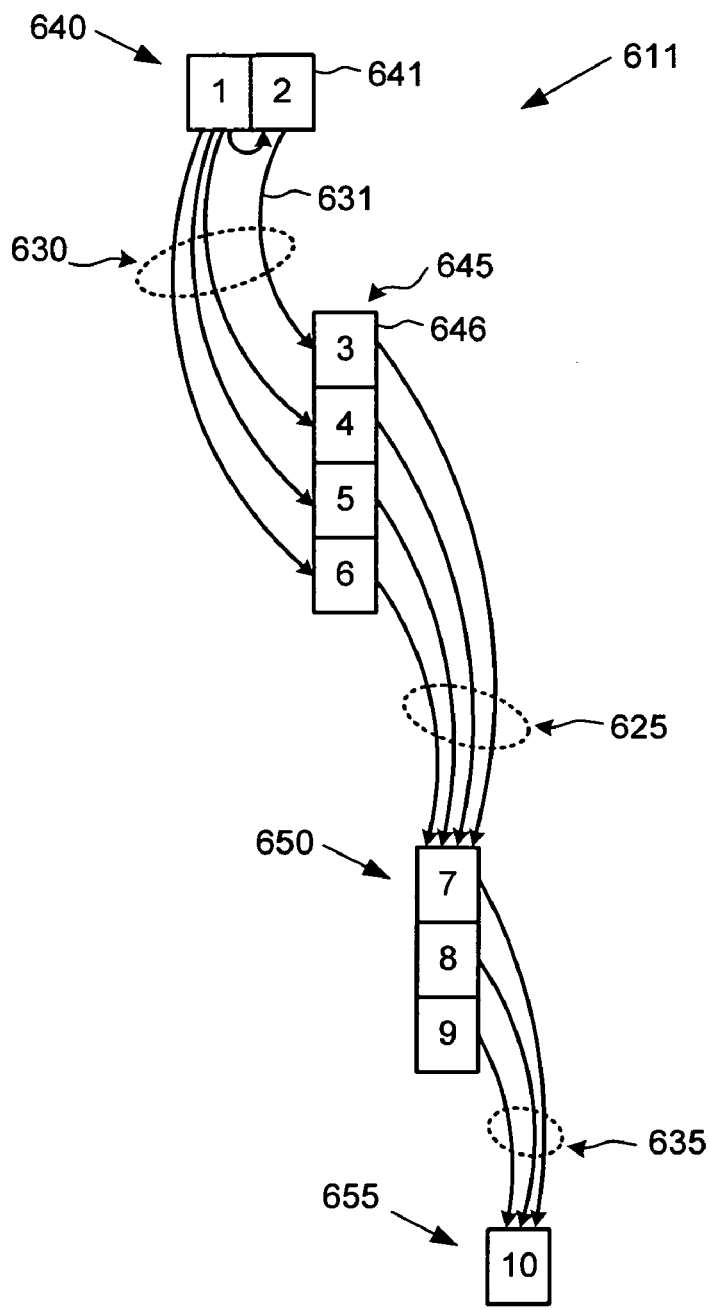
FIG. 6B is a block diagram illustrating an exemplary configuration for distributed execution of the portions of a circuit testing algorithm given the dependencies of FIG. 6B.

As shown with reference to FIG. 6, an algorithm 610 can be divided into a plurality of portions. Some portions are independent of some of the other portions, whereas some other portions are dependent on some other portions. For instance, as shown in FIG. 6A algorithm portion 2 at 620 is dependent on algorithm portion 1 at 615. Likewise, the arrows at 630, 625 and 635 indicate other dependencies. However, once the dependencies within an algorithm (e.g., 610) are understood then the portions that are independent from each other can be executed independently. Thus, the allocation 611 in FIG. 6B is one such exemplary allocation by which tasks within task groups 645 and 650, can be executed in parallel with each other (e.g., on some combination of separate processors for instance). However, in this example, the dependencies (e.g., 630, 635 and 640) are maintained. As a result, for instance, the execution of task 3 at 646 still comes later in time from execution of task 2 at 641. However, this allocation is still non-sequential is the sense that it not strictly sequential as shown at 610 in FIG. 6A.

One specific example is the computation of test patterns. For instance, the execution of an algorithm related to computation of a single test pattern or group of test patterns can be treated as a distributable task. However, the parallelism that can be achieved can be limited somewhat due to the use of any periodic calls to fault simulation algorithms as a natural synchronization point. Thus in one embodiment, calls to execute test pattern generation algorithms or portions thereof made between calls to related fault simulation algorithms are considered for distribution for execution in parallel with each other, but not in parallel with computations performed before the previous simulation or after the following simulation.

Figure 7A:
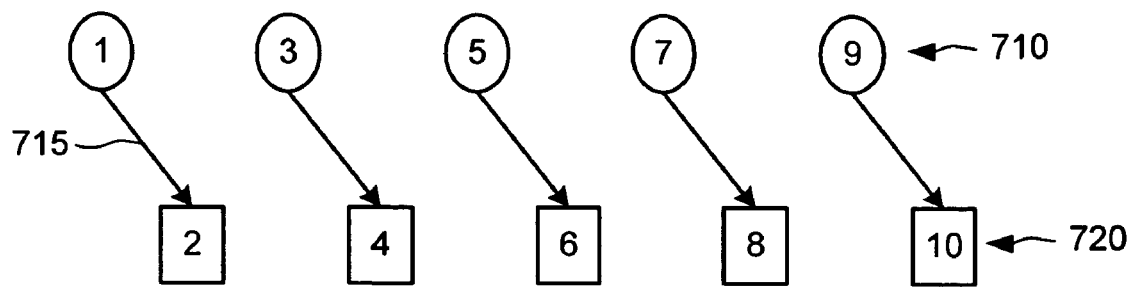
FIG. 7A is a block diagram illustrating an exemplary sequential order for execution of algorithm portions and processing of the results thereof.
Figure 7B:
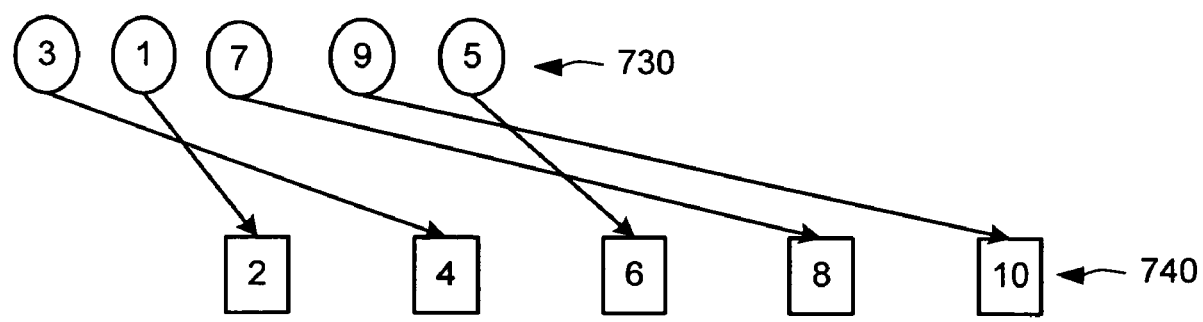
FIG. 7B is a block diagram illustrating an exemplary order for processing results of execution of algorithm portions of FIG. 7A conducted in a non-sequential manner.

Exemplary Order for Processing of Results from Execution of Circuit Testing Algorithms or Portions thereof FIG. 7A illustrates one exemplary order in which the results from execution of circuiting testing algorithms or portions thereof are processed. For instance, algorithms or portions thereof can be executed in a sequential order as shown in row 710 and their corresponding results (e.g., indicated by an arrow such as 715) can be processed in order as shown in the row 720. However, depending on the relationships between the various algorithms or portions thereof at least some of them can be executed in parallel through distributed processing and as a result, possibly not in exact sequence as before. Thus, as shown in FIG. 7B, if the distribution of the algorithms or portions thereof could result in a processing order as indicated in row 730 (e.g., indicating that task 3 is executed before task 1). However, to ensure consistency the results would need to be processed in the predetermined order as shown in row 740. This, for instance, ensures that the sequential algorithms process the results in a predetermined order regardless of the order in which their components are computed and their corresponding results obtained.

Furthermore, results related to execution of algorithms or portions thereof need not be processed on the same host as they are generated. For instance, results obtained from distributed processing may have to be collected and processed by the controlling processor (e.g., 110 of FIG. 1). Thus, results may have to be passed back to the controlling processor for further processing. Other implementations are possible wherein the results of distributed execution of algorithms or portions thereof are collected and processed by a processor other than the controlling processor (e.g., one of the controlled processors 120 or 130 of FIG. 1).

In some cases, whether an algorithm needs to be executed or not is dependent on the results from execution of previously executed algorithms or portions thereof, so it is not always possible to know in advance exactly which algorithms or portions thereof are to be executed (e.g., in a distributed manner). Thus, in one embodiment, selected algorithms or portions thereof are executed in anticipation of being needed later by portions of an algorithm or other algorithm. However, the overall algorithm may not use all such results. Such speculative processing can be executed by the controlling processor or a controlled processor or some combination thereof. Results from such speculative processing that turn out to be unneeded can be discarded, or saved for later use if there is a potential need for them.

Figure 8:
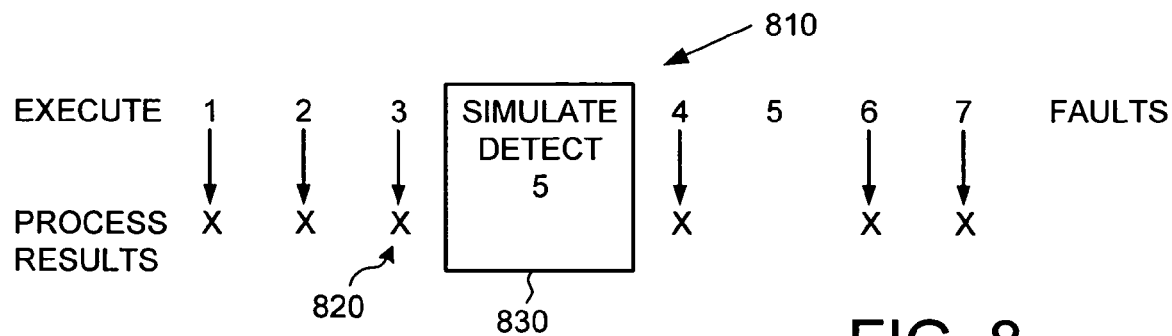
FIG. 8 is a block diagram that illustrates an exemplary order for executing circuit testing algorithms based on a fault targeting order and speculatively assuming that all faults in the order should be separately targeted.

FIG. 8 illustrates the principle of speculative processing. At 810, algorithm portions targeting faults 1-7 are executed (e.g., in parallel) with anticipation that they may be needed. However, as results of these executions are processed 820 there may be period fault simulations (e.g., 830) whereby some faults (e.g., 5) may be detected by one of the previously generated patterns and as such, there would have been no need to target fault 5. However, since this hindsight is not always available, execution of algorithms or portions thereof related to targeting is speculatively conducted anyway. In one embodiment, results found to be unneeded are simply discarded.

Obviously it is desirable to accurately predict which results will be needed, and thus, limiting the number of discarded results, which represents wasted computing effort. To determine what distributed calls may be needed is often tricky, especially if the results of the sequential processing directly affect the sequence. The dependencies can be minimized by lessening the effects of synchronization points on the algorithm. One example relates to the fault processing order used during dynamic compaction. For instance, faults are targeted in a fixed basic targeting order throughout the execution of an entire algorithm related to generating test patterns, but algorithm portions related to targeting faults that were previously detected are simply skipped instead of recomputing a new fixed fault targeting order at each synchronization point. The basic order in one embodiment is simply the original fault targeting order. Thus, the basic order in which the results of distributed calls may be needed is predetermined to reduce the effects of the sequential portions of the algorithm on the calling order of otherwise independent tasks. For instance, the fault targeting order is predetermined independently of sequential processing results other than skipping previously detected faults. Making distributed calls in the order they may be needed not only reduces the probability that a completed result will not be needed, but it also reduces the need to keep a lot of distributed results around, reducing memory requirements.

Exemplary Methods of Reducing the Sequential Nature of Algorithms

Many current test pattern generation algorithms are highly sequential, which makes the task of treating the generation of subsequent test patterns independently difficult. For instance, in some cases it may not be possible make individual portions of a highly sequential test pattern generation algorithm completely independent from each other however, it may be possible to limit the need for independence to a smaller group of algorithm portions than the number of test pattern algorithms that may be executed between simulation calls. For instance, the need to make distributed tasks run completely independently of one another can be mitigated by delaying the use of the results of one task by other tasks until some number N tasks later, allowing consistent results to be achieved with up to N independent tasks being executed in a distributed manner existing at any given time.

Figure 9A:
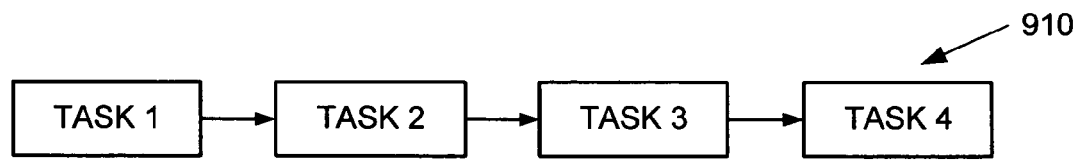
FIG. 9A is a block diagram illustrating an exemplary sequential order for task execution.
Figure 9B:
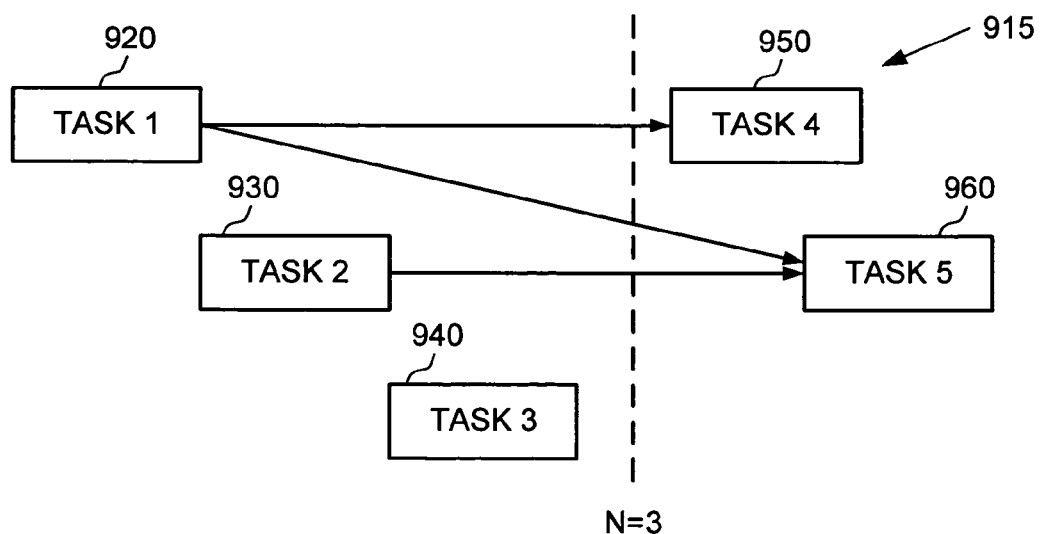
FIG. 9B is a block diagram illustrating an exemplary configuration of non-sequential processing if a rolling window of three tasks of FIG. 9B are made independent of each other.

In this manner a "rolling" sequence of N independent tasks is created. This is described further below with the aid of the illustration in FIG. 9A wherein the previously strictly sequential algorithm 910 is changed to create a rolling window of N=3 tasks of independence that can incrementally be advanced along the list of tasks yet to be executed comprising the algorithm as shown at 915 is FIG. 9B. Thus, tasks 1-3, at 920, 930 and 940, respectively can be executed in parallel, if need be. Dependencies can be restricted to be outside the window. For instance, in one iteration, task 4 at 950 can depend on task 1 at 920 since it would never share a rolling independence window of size N=3 with task 1. Likewise, task 5 at 960 can depend on both tasks 1 and 2 since it would never share a rolling independence window of size N=3 with tasks 1 and 2.

Figure 10:
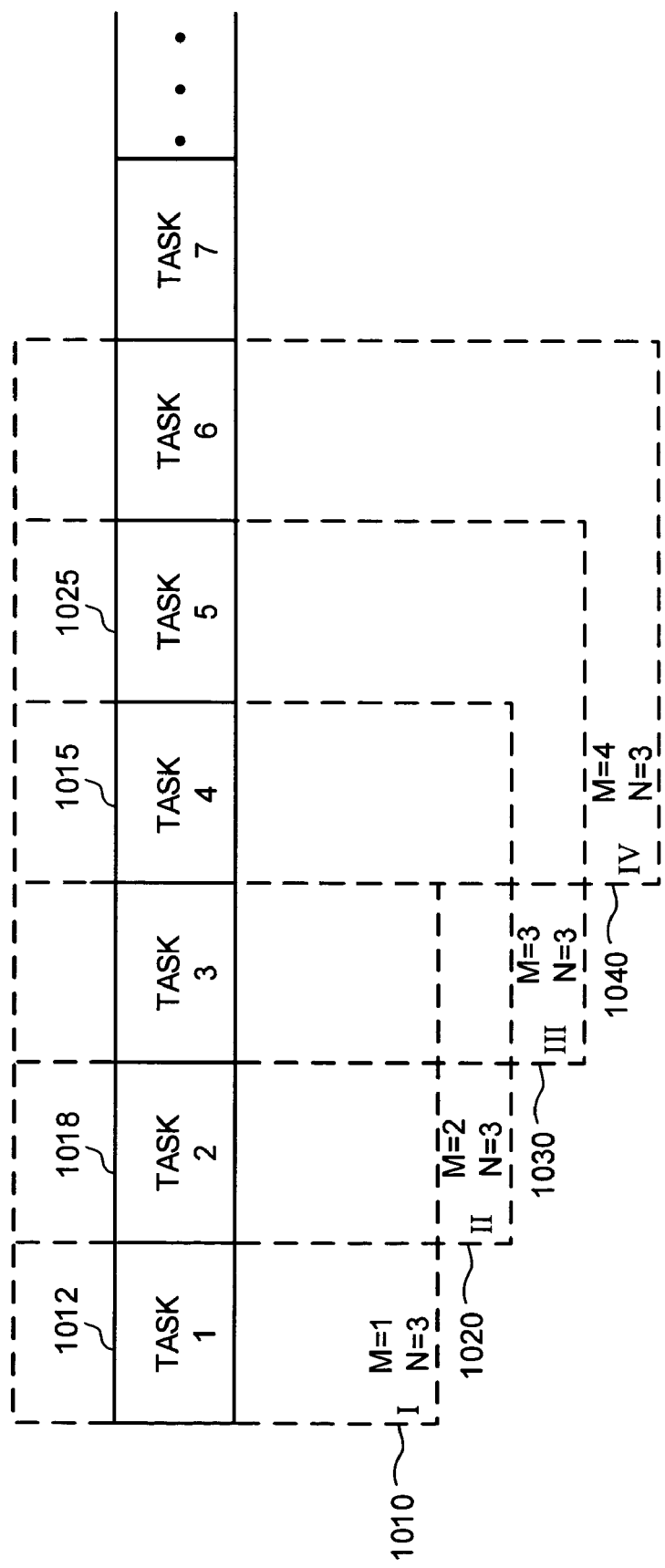
FIG. 10 is a block diagram illustrating an exemplary configuration for non-sequential processing of tasks wherein a rolling window of three tasks can be executed in parallel.

This is illustrated further at FIG. 10. At the first iteration (e.g., M=1 at 1010), a first rolling window 1010 of N=3 tasks (e.g., tasks 1-3) is created and further iterations (M=2 (tasks 2-4) at 1020, M=3 (tasks 3-5) at 1030 and M=4 (tasks 4-6) at 1040) create other rolling windows. Tasks within a window are guaranteed to be independent from each other and thus, conversely any dependency is restricted to be outside the window. For instance, in the first iteration, task 4 at 1015 can depend on task 1 at 1012. Thus, once task 1 at 1012 is complete, its results can be used in the determination of the task 4 at 1015. When task 1 at 1012 and task 2 at 1018 have completed, their results can be used in the determination of the task 5 at 1025. The window size in the illustration is N=3 but it is not so restricted. In a non-distributed algorithm, N is 1, and all results (directly or indirectly) are used in the determination of the next task. However, with the creation of the rolling N independent tasks, the benefits of distributed processing can be realized for up to the N tasks at any given time while maintaining consistent results with a non-distributed run using the same calling window of N independent tasks.

One technique for reducing the dependencies between circuit testing algorithms or portions thereof involves the manner which fault targeting is managed. For instance, the faults targeted in each test pattern generation algorithm portions can be made distinct from those considered in the test pattern generation algorithms portions executed in parallel with it. Thus, computations of test patterns that must be performed independently (e.g., in parallel) can use non-overlapping fault targeting orders. This can ensure that no two patterns computed in parallel target the same fault, eliminating targeting order as a possible dependency between computations. While it is possible that a test pattern for a given fault will also detect a fault that is targeted in a different test pattern, if this condition is not normally detected in a non-distributed algorithm (e.g. due to not simulating each pattern individually), the loss in algorithm efficiency can be eliminated.

FIG. 11A illustrates exemplary fault targeting 1100. As shown, for an exemplary configuration of three parallel processors, distributed allocation comprises test pattern generation tasks (e.g., 1115, 1120, and 1125) that target completely non-overlapping sets of faults. For instance, task 1 at 1115 targets faults, 1, 4, and 7, whereas tasks 2 and 3 at 1120 and 1125 target faults 2, 5, and 8 and 3, 6, and 9, respectively.

Alternatively, above requirement for strict non-overlapping fault targeting orders can be relaxed a bit by initially using non-overlapping fault targeting orders, but allowing for the possibility of overlapping with a fault targeted early in the computation of another pattern or pattern group. This technique restricts possible fault target overlaps to points later in the targeting order when the probability of successfully using an overlap fault is lower. FIG. 11B illustrates this principle whereby the fault targeting order associated with tasks 1-3 (e.g., 1115, 1120, and 1125) is non-overlapping initially at 1130, but contains overlaps later on at 1140.

If in fact two patterns end up using the same fault there are several remedies possible to maintain consistency of results between distributed and non-distributed runs of the algorithm. For instance, the non-distributed algorithm can be ensured to use the same targeting order as the distributed algorithm. This can potentially reduce the effectiveness of the overall algorithm in favor of consistency of distributed results. Also, a generated pattern that uses the same fault as a previous pattern can be disregarded, or execution of the distributed algorithms can be backtracked to the point of fault target overlap and recomputed from there. This can add a lot of complexity to the distributed algorithm, both for the pattern in question and those following it, and may reduce the faster execution obtained by distributing to a given number of processors.

Figure 12:
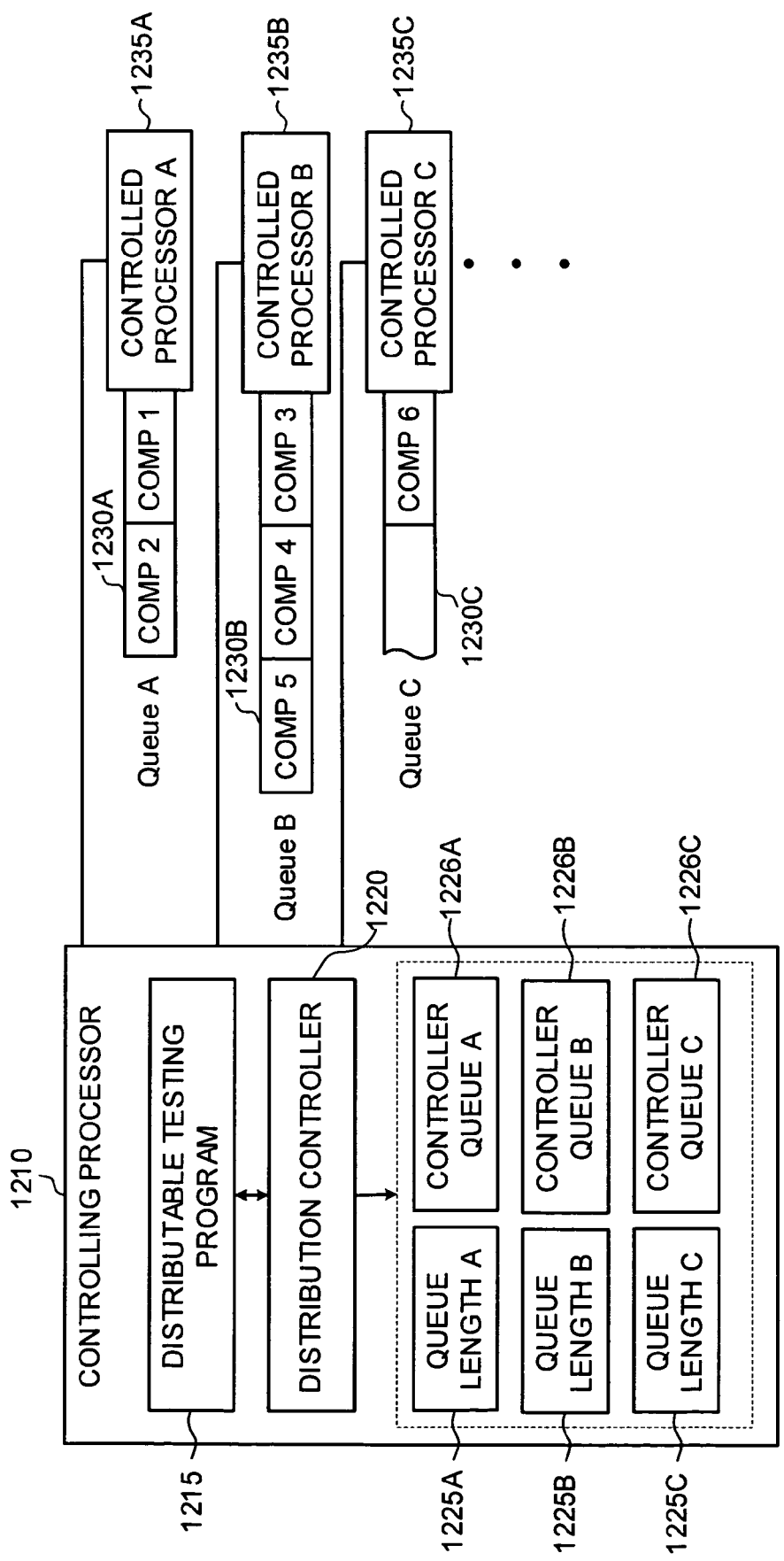
FIG. 12 is a block diagram illustrating an exemplary system for distributed execution of circuit testing algorithms or portions thereof over allocated to be performed over a plurality of processors.

Exemplary Overall Methods of Allocating and Managing Execution of Circuit Testing Algorithms or Portions thereof in a Distributed Manner Once algorithms or portions thereof are made distributable, they can be allocated to be performed in a distributed manner over a plurality of processors in a network (e.g., 100 of FIG. 1) having at least one controlling processor (e.g., 110) and one or more controlled processors (e.g., 120 and 130). FIG. 12 illustrates this in additional detail. On one implementation, execution of a distributable testing program 1215 having algorithms and portions thereof is allocated by a controlling processor 1210 according to a distribution controller 1220. The controlling processor 1210 maintains a set of queue lengths (e.g., 1225A-C) and controller queues (e.g., 1226A-C) that correspond to controlled processors 1235A-C, respectively. Based at least in part on the queue lengths, (e.g., 1225A-C), the controller queues (1226A-C) and ultimately the execution queues 1230A-C of the processors 1235A-C are populated to perform task allocation. Allocation can be at many levels including entire algorithms or portions thereof. Also, the controlling processor 1210 can maintain a queue length (e.g., 1225 A-C) for itself through which it can control the allocation of tasks to be executed by itself.

The queue length (e.g., 1225 A-C) is defined in terms of the number of distinct algorithms or portions thereof that can be assigned to a corresponding processor. The queue length (e.g., 1225A-C) that each controller queue (e.g., 1226A-C) can have is adjustable based on various factors. For instance, queue lengths can be adjusted based on responses from controlled processors (e.g., 1235A-C) and other factors, to be discussed below. However, to begin with, with no a priori knowledge of the network and/or controlled processor responses, the queue lengths (e.g., 1225A-C) of the execution queues are initially set to be equal. The actual queue lengths can initially be selected based on factors such as, processor type, speed, or other data that predicts overall response times expected from the processors (e.g., 1235A-C).

However, as execution progresses, for various reasons including capabilities of the individual processors for instance, some processors may execute all of their tasks quickly. In this case, their corresponding queue lengths (e.g., one or more of 1225A-C) can be increased. Thus, more tasks are automatically allocated to faster processors. The controlling processor 1210 can examine the number of unperformed tasks in its controlled queues (e.g., 1226A-C). Alternatively, the controlled processors (e.g., one or more of 1235A-C) themselves can notify the controlling processor 1210 about the status of their corresponding execution queues (e.g., 1230A-C). The controlling processor 1210 can then make adjustments to queue lengths (e.g., 1225A-C) based on such information. For instance, controlled processors (e.g., one or more of 1235A-C) with unperformed yet allocated tasks below some threshold number can have their associated queue length (e.g., 1225A-C) increased, which eventually has the effect of increasing the number of tasks being allocated to the faster processors. This can help in adjusting for network delays that could result in the controlled processors (e.g., one of 1235A-C) having exhausted their execution queues (e.g., 1230A-C) while the controlled processor 1210 has not yet seen the corresponding results. This scheme can also result in the controlled processors (e.g., one or more of 1235A-C) being more likely to always have tasks to be executed, thus, increasing their throughput.

The timing of such adjustments is critical due to possible delays and the asynchronous nature of cross communication between controlling processor 1210 and controlled processors (e.g., 1235A-C). This can be addressed by the controlling processor 1210 considering adjustments to queue length data (e.g., 1225A-C) upon the controlled processors (e.g., one or more of 1235A-C) acknowledging the receipt tasks of a previously allocated block of tasks. In this manner, the controlling processor 1210 can avoid increasing the queue lengths prematurely while other allocated tasks are still in transit to the controlled processors (e.g., 1235A-C).

In addition to adjusting queue lengths (e.g., 1225A-C), the actual allocation of tasks to processors (e.g., 1235A-C) can also depend on the status of the controller queues (e.g., 1226A,-C). For instance, as tasks become available for allocation they can be assigned to the processor (e.g., 1235A-C) with the largest number of available slots in its controller queue (e.g., 1226A-C). The available slots for each controlled processor (e.g., 1235A-C) is determined based on the difference between their corresponding queue length (e.g., 1225A-C) and the number of tasks currently allocated to the processor and for which results have yet to be received (e.g., the current status of its controller queue). This gives priority in task allocation to the controlled processors (e.g., 1235A-C) that are emptying their queues fastest. However, once equalize the number of available slots between at least a plurality of processors the next available task can be allocated to any one of such plurality of processors. In one example, such allocation can substantially be on a round-robin basis. The table 1300 in FIG. 13 illustrates this principle. In rows at 1310 the queue Q2 clearly has the most available slots and as a result, the tasks are assigned to Q2 until in row 1320 queues Q1 and Q2 1325 have an equal number of available slots. In this case, the next available slot can be assigned to any one of Q1 or Q2. If queue Q1 is chosen then later at 1325, Q2 is now left the largest number of available slots and becomes the queue to which the next available task is assigned. Thus, in rows 1320 and 1325, the task allocation was based on a round-robin basis between two queues. At 1330, the three different queues Q1, Q2, and Q3 have equal number of available slots. Then any one of the queues Q1, Q2, and Q3 can be chosen for the next task assignment. Later, at 1335, allocation based on the largest available number of slots continues until the number of available slots equalizes again at 1340.

As noted above, the controlling processor (e.g., 1210 in FIG. 12) can allocate some tasks (e.g., independent and non-independent) to be executed by itself. It is possible that sometimes, processing of results by the controlling processor 1210 can be too time consuming. As a result, it is possible that the controlled processors (e.g., 1235A-C) may get too far ahead of the controlling processor 1210, which can cause the controlling processor 1210 to perform extra work requesting tasks and processing task results that it may later determine are unneeded. One method of preventing this would be to have the controlling processor 1210 monitor the total number of unprocessed results (those provided to the controlling processor from the controlled processors, for instance) and tasks allocated but whose results have not yet been provided to the controlling processor 1210 and to limit further allocation to a given processor if its corresponding total number is greater than or equal to some threshold number.

In one embodiment, only successful or useful results are desirably considered in determining whether the threshold limit has been reached or not. A successful result for a test pattern generation algorithm for instance, could mean that test data useful for pattern generation was obtained. In some other cases the algorithm could abort and be considered unsuccessful. In case of fault simulation, there typically are no unsuccessful results.

In situations where the ratio of useful results to non-useful results is slow, it makes sense to allow more outstanding tasks, to ensure that the controlling processor has useful results available when it needs them. The controlling processor can also proactively estimate the number of outstanding tasks that will likely be successful based on empirical results or other factors when determining the limit. Likelihood for instance, can be based on the percentage of past results that were successful. So for a circuit that has proven to be a difficult circuit to test, the assumption is made that it will continue to be difficult to test thus likely to yield a greater number of unsuccessful results.

In another example, the threshold limit for the total number of unprocessed results and outstanding tasks is set as a linear function of the number of controlled processors in use. In setting such threshold limits, to not have the execution queues of all available controlled processors filled is undesirable. For instance, it is possible, that a controlled processor with the largest queue can always receive the next task allocation, thus causing the allocation to be uneven, leaving some other controlled processors under utilized. Thus, a more balanced assignment of tasks to processors is needed when the threshold limit can prevent all controlled processor execution queues from being filled. As an example, a balanced allocation uses a weighted algorithm that chooses a queue randomly but partially based on the percentage of open queue slots it contains. In this example, the overall number of available queue slots is determined. An integer value is chosen randomly in some known range (e.g., 0 to N-1 with N being the number of available slots). Then the controlled processor queues are traversed in a round-robin fashion. If a controlled processor queue is completely empty, then that processor is chosen for allocation, else if the generated random number's value is less than the number of available queue slots on the particular controlled processor, then that particular controlled processor is chosen. Else, the number of available queue slots on the controlled processor from the generated value is subtracted from the value and the next processor in the round robin ordering is examined. This, however, is one of many possible ways to implement a more balanced assignment of tasks to processors.

In one implementation, multiple sets of queue lengths can be maintained for each controlled processor. Different queue lengths may be used for task allocation to a particular processor depending on the granularity of the tasks being executed on the controlling processor. This allows larger queue lengths to be used when the controlling processor is executing larger tasks (i.e. not checking for responses and allocating new tasks to queues as often), and smaller queue lengths can be used when the controlling processor is executing smaller tasks, rather than always using queue lengths large long enough to accommodate the larger tasks. When the controlling processor switches from one task granularity to another, the queue lengths used for task allocation to some of the controlled processors is also switched. However, when switching to a shorter queue length, tasks already in the execution queue of a controlled processor remain allocated to the same processor even if the number of tasks in the execution queue now exceeds the new lower queue size. This avoids the need to remove tasks from queues when the queue size is reduced, and to reassign them later.

The controlling processor can choose to perform tasks that would otherwise have been assigned to controlled processors when there is no need for processing of controlled processor tasks (e.g., task allocation to controlled processor or receiving results from the controlled processors or processing the received results). This allows useful work to be accomplished by the controlling processor instead of waiting for results. In the case of fault tolerance, this mechanism provides a fall-back position for cases when all controlled processor have died (i.e. the controlling processor is processing the remaining tasks).

An initial backlog of results needed from controlled processors can also prevented by not allocating tasks to controlled processors until they acknowledge that they are ready to process tasks. This allows the controlling processor to choose to execute the tasks needed first itself so that it can have the results immediately rather than waiting for the controlled processors. In the case of execution of tasks related to test pattern generation algorithms, this can allow the controlling processor to both generate and simulate several groups of test patterns before the controlled processors are ready to participate. Since simulating the first test patterns typically removes a large percentage of faults from consideration that would otherwise be considered if the controlling processor had not been able to reach the simulation step, a lot of speculative work is eliminated that might otherwise have been performed by the controlling processor and then discarded later.

Alternatively, allocation of tasks to controlled processors is limited until the controlling processor determines that they are ready to process them. Doing this instead of preventing any allocation until the controlled processors signal that they are available generally allows the controlled processors to participate sooner in the distributed execution, as there is typically no delay between them becoming ready to process tasks and actually starting to process them. This could also could be accomplished without limiting task allocation as above the allocation by initially allocating those tasks to controlled processors, whose results are not needed immediately, and possibly adjusting the allocation as the controlling processor proceeds further and determines either that it now needs the results of the allocated tasks or that they are no longer needed at all.

The process of limiting allocation to controlled processors initially may comprise simply using the default initial queue size as described previously, or using a small queue size initially and then increasing it once the controlled processors are ready. The acknowledgment of readiness by controlled processors may be through an explicit notification or simply by the way of receipt of results of allocated tasks.

Tasks that are determined to be needed sooner by the overall algorithm can be reallocated to be executed on the controlling processor from the execution queues of the controlled processors processes. In situations where the processing of results of earlier tasks can affect the need for the results of later tasks, this can be useful to increase the utility of the tasks being performed on the controlling processor. Tasks that are reallocated from a controlled processor are desirably chosen from later slots in its queue rather than the front of the queue in order to minimize the chances of duplicating work already being performed or about to be performed by the controlled processor.

Figure 14:
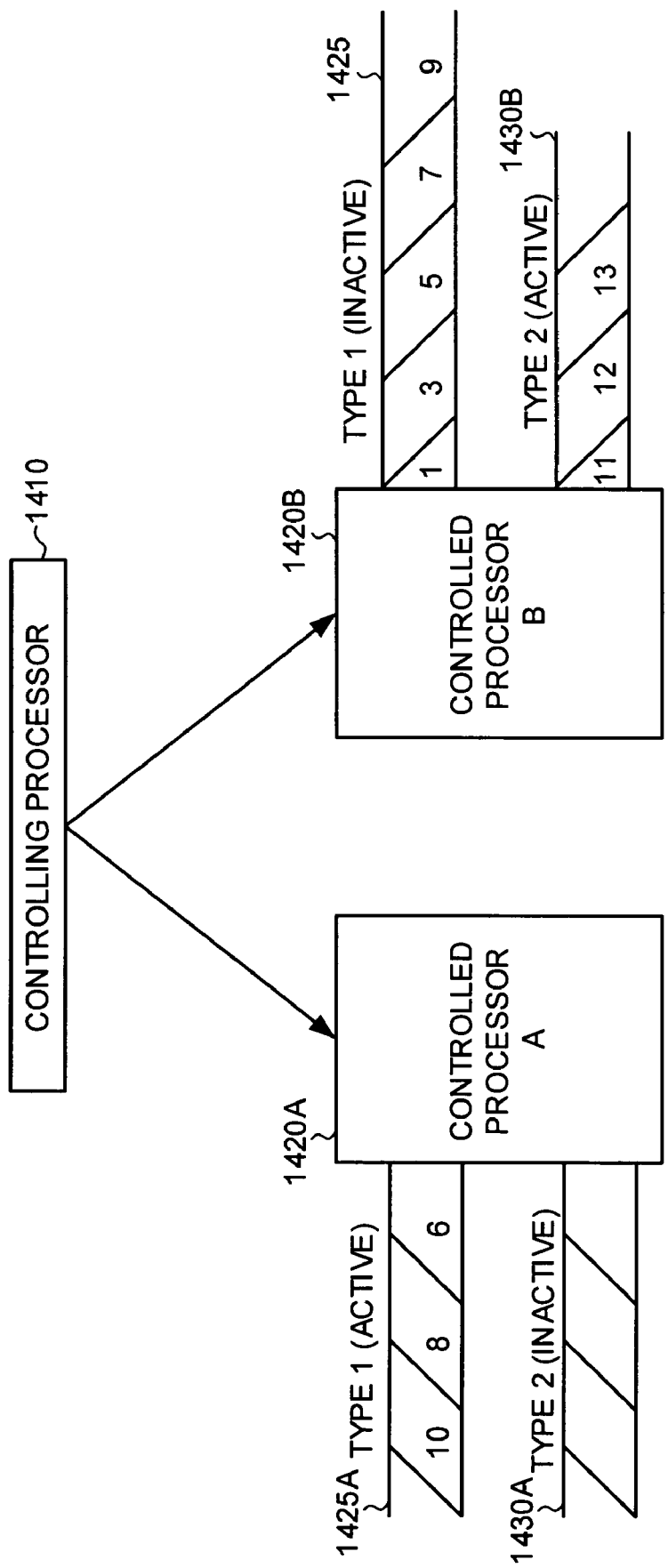
FIG. 14 is a block diagram illustrating an exemplary scheme for allocation of tasks to be executed between an exemplary set of processors with each maintaining a plurality of queues correspondingly associated with different types of tasks.

Different types of tasks can be allocated to a given controlled processor by the controlling processor. However, as time progresses, the controlling processor can reallocate tasks of one type from a processor currently executing the tasks of another type to a processor currently executing tasks of the first type. This allows tasks needed earlier to be executed sooner instead of being delayed by the fact that the processors to which they have been assigned are currently executing tasks of another type. FIG. 14 illustrates this principle. In this example, a controlling processor 1410 can allocate tasks of two different task types (e.g., types 1 and 2) between two different controlled processors (e.g., 1420A and 1420B) each of which maintain two exemplary execution queues (e.g., 1425A, 1430A, 1425B and 1430B). Thus, currently if the controlled processor B at 1420B is actively executing from queue 1430B instead of 1425A then tasks of type 1 can be reallocated to the controlled processor A at 1420A where the queue 1425A is active and is executing tasks of type 1.

As a result, in one embodiment, the controlled processors desirably maintain separate queues for each type of task and they select tasks to execute from one queue at a time. The number of queues and the types associated therewith are adjustable. The selection of tasks to execute from any one of a plurality of queues can be based on some suitable prioritization method. Prioritization can be based on a number of different factors, for instance, it could be based on any costs associated with switching between types of task. This could be taken into account along with the number of tasks in the current execution queue and their type. On the other hand, one type of task can always be given priority over another type (e.g., fault simulation tasks can take priority over test pattern generation tasks.)

The controlling processor can instruct the controlled processors as to which queue to use at a particular time. This is especially useful in test pattern generation where there may be a cost associated with switching between test generation and simulation task types. In cases where the controlling processor selects the types of tasks different controlled processors can perform (e.g., fault simulation versus pattern generation), the controlling processor could have some controlled processors perform only one type of task, and others perform multiple types of tasks. In one exemplary implementation, the controlling processor selects controlled processors for certain tasks based on the speed with which they executed previously allocated tasks. Speed data can be collected by the controlled processors recording the amount of time they spend on tasks and then sending the data to the controlling processor for use in determining the relative speeds of the controlled processors. This eliminates any issues with network delay and the frequency of the controlling processor checking controlled processor queues from the determination of the fastest controlled processors. The controlling processor can also consider static data on the known speed of the controlled processors. Speed data can be a range of speeds within which controlled processors are actually operating.

The consideration of processor speed offers several possible benefits. For instance, the controlling processor can use faster controlled processors for results that are needed sooner. In addition, controlled processor speed could be considered when assigning tasks in round-robin fashion to give the first tasks in any given round to the faster processors.

Some processing related to execution of circuit testing algorithm or portions thereof can be redundant in nature. For instance, in some test pattern generation algorithms, all controlled processors that execute fault simulation tasks for a given group of patterns will have to first perform a good circuit simulation of those patterns. This is an example of redundant work that limits the potential benefit of distribution. To reduce its negative effects, the controlling processor could limit the amount of per-processor redundant work performed by allocating tasks requiring redundant work to fewer and faster processors. For instance, by choosing the fastest processors for fault simulation and using as few of these processors as possible, while keeping other processors busy with other tasks, the total amount of redundant work can be reduced, thus improving the speed overall.

The controlling processor can adjust the number of controlled processor performing different tasks depending on the relative amount of work performed by processors performing different tasks. For instance, while performing fault simulation, a determination of whether more or fewer processors are needed in the next simulation can be made by comparing the number of useful, pending test pattern generation results that are waiting at some point in the cycle. This determination is desirably done prior to the simulation so that the number of simulation processors that are needed can be decreased, if few results from prior processing are waiting.

As noted above, the orchestration of task allocation can sometimes be affected by such factors as how often the controlling processor can verify whether results have been received or how often it can receive the data on the current status of execution queues of controlled processors. To address such issues, the controlling processor can use a separate thread or process for monitoring controlled processor responses and submitting new tasks to them. A thread is basically a separate process running independently that shares the same data used by its creator, so the controlling processor could be executing a task or processing results while another thread checks for controlled processor responses and refills their queues. This has the effect of eliminating issues of granularity of tasks allocated to the controlling processor and allows for more regular checking of results and potentially keeping the controlled processors busier while using smaller queue sizes.

Allocation of tasks may also be affected by the current status of operability of available controlled processors in a network. For instance, one or more controlled processor may terminate or can otherwise become unresponsive for various reasons. Tasks allocated to such processors can be reassigned to other controlled processors or the controlling processor may itself take on the tasks. The determination of whether a controlled processor is unresponsive or terminated can, for instance, be made based on the amount of time since the last result was received from a controlled processor. The reallocation can be performed in various ways. Tasks can be reallocated to selected controlled processors immediately, even if it means overfilling their queues beyond their existing task queue lengths. However, if no other controlled processors are running then these tasks are executed by the controlling processor itself. Alternatively, the tasks can be resubmitted to other controlled processes once their task execution queue slots become available or can be allocated to be executed by the controlling processor when it next executes an independent task.

Coordinating execution of reallocated tasks with previously scheduled tasks can be managed in many different ways. For instance, tasks that are reallocated to other controlled processors can be executed relative to other previously allocated tasks based on their initial assignment order or priority. This prevents those reallocated tasks from becoming bottlenecks in the processing of results.

Figure 15:
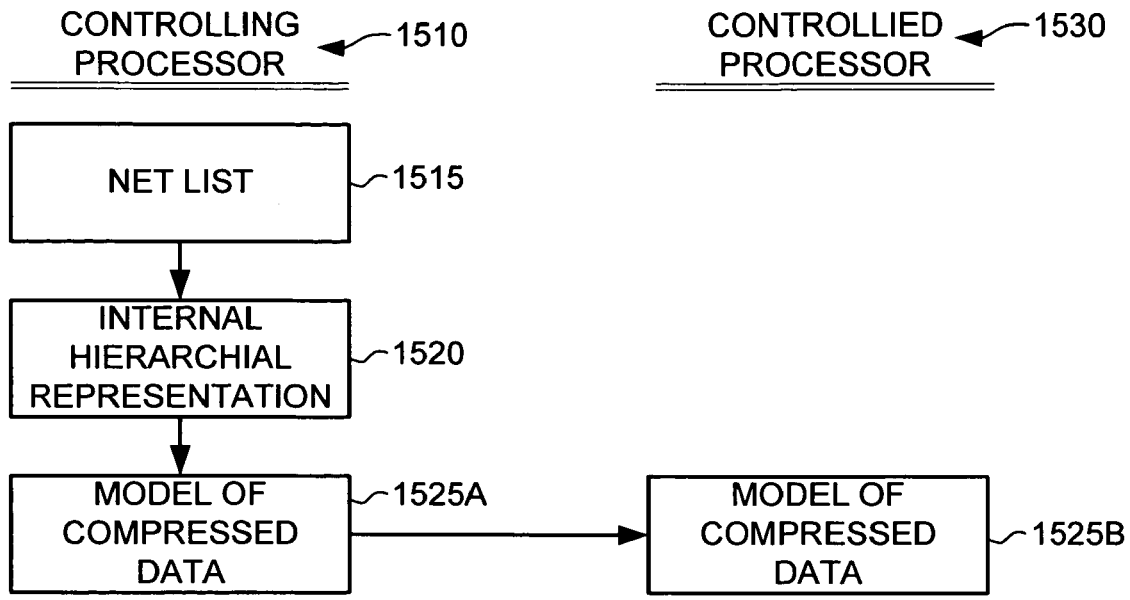
FIG. 15 is a flow diagram illustrating an exemplary exchange of data related to circuit testing between a controlling processor and a controlled processor.
Figure 16:
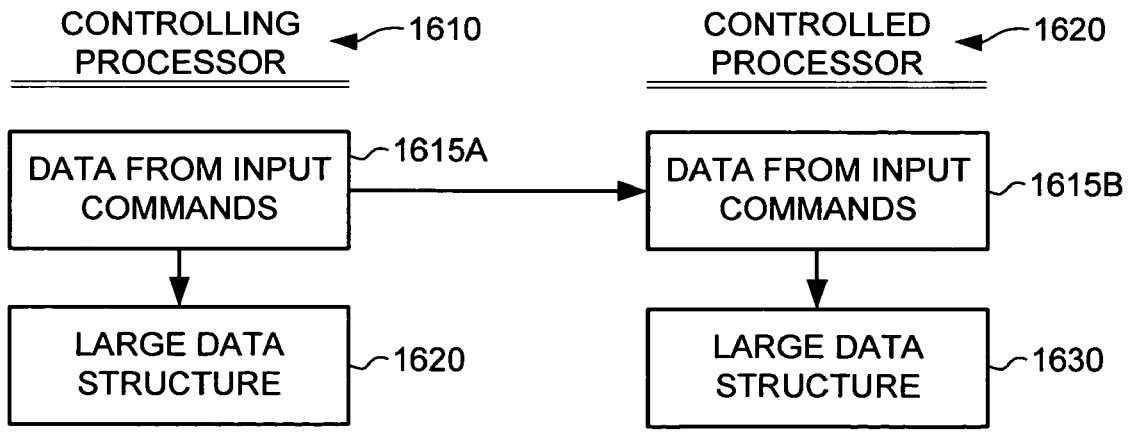
FIG. 16 is a flow diagram illustrating an exemplary exchange of data from input commands from a controlling processor to controlled processor for additional processing by the controlled processor

Exemplary Methods of Exchanging Data Related to Distributed Processing of Circuit Testing Algorithms In one embodiment, large data structures related to circuit testing are created on the controlling processor and shared with the controlled processor over the network appropriately, rather than passing (or reading) data required to build these large data structures and then having these structures created on the controlled processors. For example, as shown in FIG. 15, a netlist 1515 of the circuit under test is read into the controlling processor 1510 and internal data structures such as a hierarchical representation 1520 of the circuit under test is created and then a compressed data file 1525A comprising the circuit information and the status of the testing program is created. It is a copy of that compressed file 1525B that then is sent to the controlled processors 1530.

In some cases, the reverse may be needed for transmission efficiency. For instance, a copy 1615B of the raw data 1615A of a command or series of command inputted into the controlling processor 1610, rather than the large data structure 1620 that could be created from such data, is what is sent to the controlled processor 1620. Then the controlled processors can derive their own large data structure 1630 from their copy of the data 1615B.

Further efficiencies can be realized by sending only small amounts of the pertinent data with each task request rather than sending all such data to the controlled processors. For instance, rather than passing a complete fault list to the controlled processors or building such a complete fault list on each processor, only the information about those faults that the particular controlled processor is being asked to work with is sent. Passing data that will not be needed by the controlled processors can be avoided. For example, data that only the controlling processor will use is not passed to the controlled processors and data is passed to only the slaves that need them.

In one embodiment, just the incremental updates to data needed by the controlled processors are sent to them rather than resending entire data structures. For instance, after passing data to controlled processors and using it for a test pattern generation command (or simulation or whatever), the users may enter additional commands that change the state of the controlling processor's data. In this case, rather than resending the entire data structure to the controlled processors at the next ATPG command, only a representation of the changed data is sent.

Figure 17:
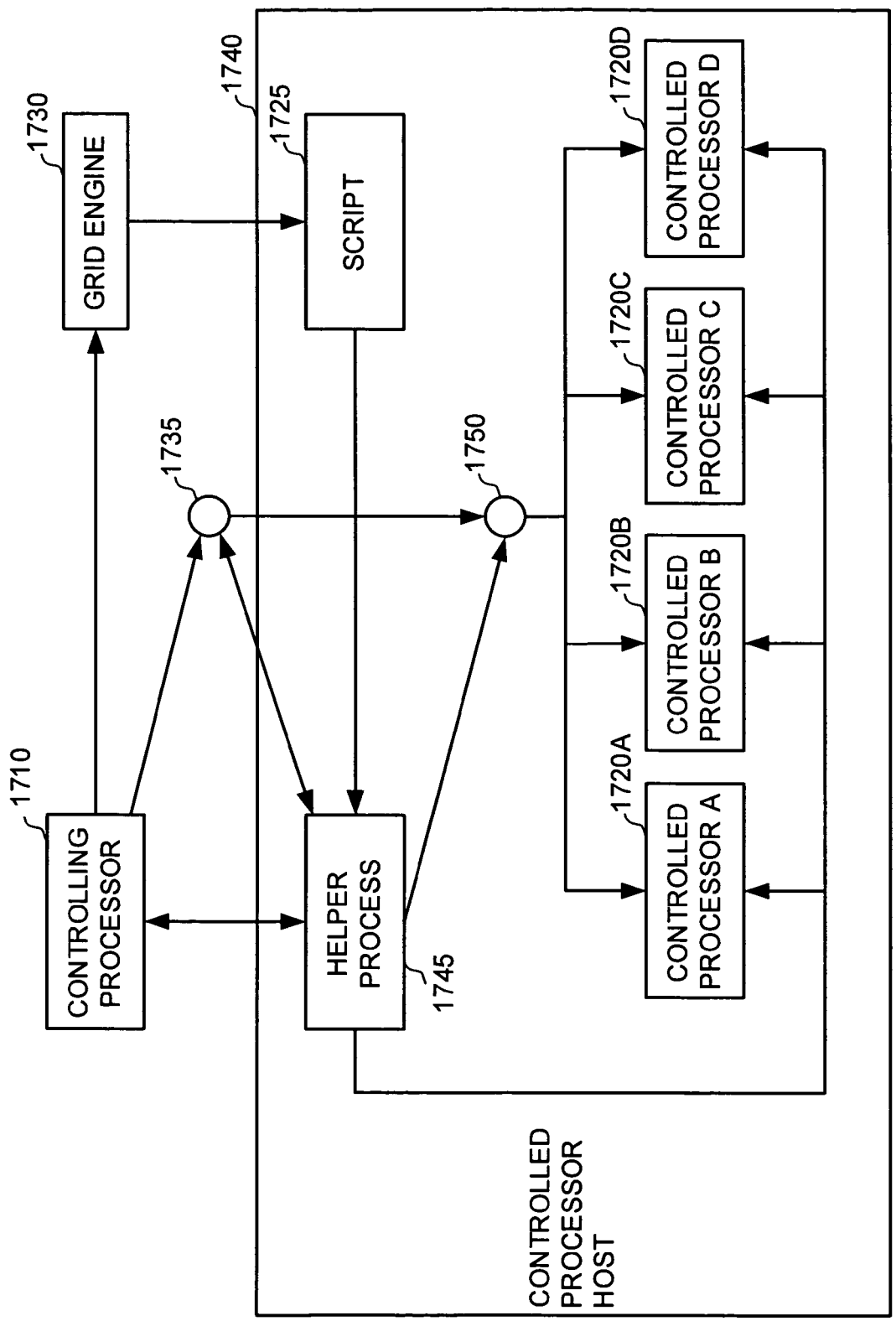
FIG. 17 is a block diagram illustrating an exemplary system for enabling communication between a controlling processor and at least one controlled processor for distributed execution of circuit testing algorithms.

Exemplary Usability and Communication Aspects of Distributed Execution of Circuit Testing Algorithms As shown in FIG. 17, communication mechanisms such as TCP and UDP can be used to coordinate the launching, message passing, and control of the distributed program and its data across a network of heterogeneous machine types (e.g., Intel Pentium®, Opteron®, Sparc®, HP®, and Itanium® architectures). When a job scheduler associated with the grid engine 1730 is used to pick a controlled processor (e.g., 1720 A-D) it is not known until execution of a script 1725 on the selected processor (e.g., one of 1720A-D), what type of architecture is associated with the selected processor (e.g., one of 1720A-D). Without this information, the appropriately compiled distributed program cannot be executed. Thus, in one implementation, a script 1725 is submitted to the job scheduler in the grid engine 1730, that when run, performs a query of the selected controlled processor's operating system (OS) and architecture type, and then selects the appropriate executable to initiate the launching of the distributed program for the selected processor (e.g., one of 1720A-D).

A single exemplary command configured as "add processor <options>" is used to specify the number of controlled processors (e.g., one of 1720A-D). Thus, this single command turns a sequential program into a distributed program. If command portion, "<options>" lists machines by their name or their internet protocol (IP) address, they are checked for correctness and availability over the internet. If one of the job schedulers (e.g., Sun grid engine (SGE) by Sun micro systems, load sharing facility (LSF) by Platform Computing, or the term GENERIC) is specified, then the selection is automatically performed by the respective job scheduler. For instance, in the controlling processor 1710, the "add processor SGE" command initiates the request to acquire four controlled processors scheduled automatically through the Sun Grid Engine scheduler.

A daemon communication process 1735 is launched by the controlling processor 1710 and the submission request is sent to the grid engine 1730. Sometime later, the job scheduler associated with grid engine 1730 selects a host 1740 and launches the script 1725. This script 1725 determines the type of operating system and machine architecture, selects the appropriate executable, and launches the task helper process 1745. The task helper process 1745 communicates (e.g., via a UDP) socket back to the controlling processor 1710, which in turn informs the communication daemon 1735 with the controlled processor task helper processes' UDP socket. The controlling communication daemon 1735 then provides information for launching the communication daemon running on the controlled host 1740.

The controlled communication daemon 1750 then connects to the controlling communication daemon 1735 (e.g., via a UDP socket) and they each initialize themselves for communication (e.g., TCP). This process repeats for every new controlled host (e.g. 1740) that the job scheduler associated with grid engine 1730 selects. The job scheduler associated with the grid engine 1730 can also select a controlled host 1740 multiple times, if it has multiple processors (e.g., 1720 A-D). In one implementation, only one controlled communication daemon 1750 is launched per controlled host 1740 and it coordinates message traffic between all the distributed processors (e.g., 1720 A-C) running on that controlled host 1740.

The controlled communication daemons (e.g., 1750) are next instructed to launch their respective distributed programs. These programs perform synchronization and initialization steps to ready themselves for the actual distributed processing. The example in FIG. 17 shows four controlled processors (1720 A-D) running on a single controlled host 1740. The interesting aspect of this orchestration is that it is virtually generic across job schedulers. Only a few details are different between SGE and LSF schedulers with respect to launching the distributed communication infrastructure. This makes possible the support of proprietary job schedulers by creating parameters to those interface details.

Submitted grid scripts are monitored to detect attempts to terminate controlled processes. If someone terminates the submitted grid script 1725, or the grid engine 1740 determines that it has run too long, the actual controlled process (which is typically the only one utilizing the CPU significantly) is also terminated.

Furthermore, a specific type of controlled processor machine can be requested. For example, only Sun Solaris®, or only 64 bit Intel® processors can be requested. Also, additional restrictions can be added to the requests for controlled processors such as, memory available, machines within a specific queue, for instance. Data needed is desirably passed through a network so that controlled processors do not need access to a shared file system. In many cases the different controlled processors may have different file systems mounted, for example if they are different machine types or are in different physical locations.

Controlled processors can be initialized incrementally as they become available rather than all at once. Initialization can take a while, as large data structures are currently sent to the slaves via the network by the controlling processor, which in the case of large designs may have to wait at times to ensure that the buffers storing the data on its way to the slaves do not overflow.

In some grid environments it takes a long time to be assigned grid resources. In such environments, the controlling processor could go ahead and start ATPG itself and add controlled processors to the overall execution as they become available. One method would be to wait a specific amount of time and then proceed with whatever is available.

Alternatively, the controlling processor could go ahead without waiting for any controlling processor, initializing all that are available when they are needed, and any ones received later as they come in. New controlled processors can be requested to replace those that terminate. Obviously, the new processors will need to be initialized. New controlled processors can be added if it can be determined that they would speed things up further. This could, for example, be based on a determination that more controlled processors would be useful, or simply exceeding a certain amount of run time.

Controlled processors can be initialized by sending data from the controlling processors. This could slow down the controlling processor and may hurt the overall speedup that is obtained.

The capability of writing the data being sent to controlled processors to a file can be maintained, and new controlled processor could read that file. Such a file could even be created in parallel with initializing the first set of slaves over the network. This has the disadvantage of requiring the slaves to have access to a specific file structure, which can be a disadvantage.

Later requested controlled processors can be initialized by having an existing one send data to the new one(s). This would temporarily reduce the parallelism being used, but would not otherwise slow down the progress being executed on the controlling processor. A separate thread or process can be used to initialize a later requested (or all) controlled processors. This takes the overhead of initialization off both the controlling processor and controlled processor, although while using a separate thread it may be necessary for one thread to wait for the other at times to ensure data consistency.

Exemplary Solutions for Host with Arbitrary Type and Model Nomenclature in the LSF Environment In case of LSF grid engines, each LSF installation is different because of the use of arbitrary names to identify the host type and model. Thus, an automatic launching onto such an environment requires a learning step to quickly and efficiently query each host with a unique type/model nomenclature for its underlying OS and machine architecture. Once this is known, the launch sequence can create a resource constraint expression suitable for submitting the controlled processor request to the job scheduler in the associated grid engine.

A learning process attempts to run an LSF command designed for quick and short remote access to a controlled host. This command can take a Unix command as an option and the distributed software receives the controlled processor OS and machine architecture so that it can associate it with the LSF type/model nomenclature.

However, on some LSF sites, even this is not allowed. In such cases, a heuristic algorithm can be employed to isolate the OS, the machine architecture, and 32- or 64-bit information. The heuristic performance may fail, or produce suboptimal resource expressions. In the event of failure, the "add processor LSF" command returns a failure code and manual techniques can then be used to describe the type/model nomenclature binding to OS and machine architecture codes.

In view of the many possible embodiments to which the principles of the disclosed technology may be applied, it should be recognized that the illustrated embodiments are only preferred examples of the disclosed technology and should not be taken as limiting the scope of the disclosed technology. Rather, the scope of the disclosed technology is defined by the following claims. We therefore claim all that comes within the scope and spirit of these claims.

We claim:

1. A method of producing test data for testing the operation of an electronic circuit comprising:
    determining independent portions and non-independent portions of at least one circuit testing algorithm, the independent portions being portions of the at least one circuit testing algorithm that are independent of results from the performance of other portions of the at least one circuit testing algorithm, and wherein the non-independent portions of the at least one circuit testing algorithm depend upon results from performing at least one other portion of the at least one circuit testing algorithm and wherein the circuit testing algorithm is at least one of a test pattern generation algorithm or a fault simulation algorithm;
    performing at least one of the independent portions of the at least one circuit testing algorithm non-sequentially to generate results for said at least one of the independent portions;
    performing at least one of the non-independent portions of the at least one circuit testing algorithm sequentially using results from a previously performed portion to generate results for said at least one of the non-independent portions of the at least one circuit testing algorithm; and
    processing the results for said at least one of the independent portions with the results for the non-independent portions to determine at least one of (i) a test pattern for use in testing the electronic circuit; and (ii) fault simulation results.

2. The method according to claim 1, wherein the at least one circuit testing algorithm is a test pattern generation algorithm and wherein processing the results comprises generating at least one test pattern.

3. The method according to claim 1, wherein the at least one circuit testing algorithm is a fault simulation algorithm and wherein processing the results comprises determining fault simulation results.

4. The method according to claim 1, wherein, the results are processed in an order the results would be processed if the independent and non-independent portions of the at least one circuit testing algorithm were performed sequentially.

5. The method according to claim 1, wherein at least a plurality of the independent portions of the at least one circuit testing algorithm are performed in parallel by plural controlled processors to produce results that are provided to a controlling processor.

6. The method according to claim 5, wherein at least one of the non-independent portions of the at least one circuit testing algorithm is performed by the controlling processor.

7. The method according to claim 1, wherein at least one of the non-independent portions of the circuit testing algorithm is performed by at least one controlled processor.

8. The method according to claim 1, wherein at least one of the independent portions of the circuit testing algorithm is performed by the controlling processor.

9. The method according to claim 1, wherein a plurality of the independent algorithm portions are performed by a controlling processor.

10. The method according to claim 1, wherein all non-independent portions of the at least one circuit testing algorithm are performed by a single controlling processor and at least one independent portion of the circuit testing algorithm is performed by at least one controlled processor that is controlled by the controlling processor.

11. The method according to claim 1, wherein independent algorithm portions are performed independently of one another.

12. The method according to claim 1, wherein at least a plurality of the independent algorithm portions are performed by one or more controlled processors.

13. The method according to claim 12, wherein processing the results comprises producing plural sets of plural test patterns, each set being generated between a respective pair of simulation calls, and wherein performing at least one of the independent portions comprises performing independent algorithm portions of circuit testing algorithms associated with a single set of plural test patterns only between each pair of simulation calls.

14. The method according to claim 12, wherein the results for the portions of the at least one circuit testing algorithm are processed by a controlling processor in a predetermined order that is independent of the order in which the independent algorithm portions are performed.

15. The method according to claim 14, further comprising discarding results from at least one of the independent algorithm portions.

16. The method according to claim 15, wherein the discarded results correspond to results from an algorithm that targets a fault that was previously detected by another algorithm.

17. The method according to claim 14, wherein independent portions of algorithms that are processed by one or more controlled processors and that target faults previously detected by test patterns processed during a previous simulation call are bypassed.

18. The method according to claim 14, wherein an order in which the independent portions of algorithms are processed by one or more controlled processors is based at least in part upon the order in which the results are to be processed by controlling processor.

19. The method according to claim 14, further comprising predetermining a basic order that results from the independent portions of algorithms are to be processed and performing the independent portions of algorithms at least in part in accordance with the basic order.

20. The method according to claim 19, wherein the basic order comprises an order in which faults are to be targeted.

21. A method according to claim 14, further comprising determining a basic fault targeting order, processing algorithm portions to provide test patterns that target the faults in the basic targeting order, but skipping the performance of algorithm portions that target faults that either have previously been detected or for which fault simulation results successfully targeting a fault are available for processing.

22. The method according to claim 14, further comprising determining a basic fault targeting order, processing fault targeting results in accordance with the basic fault targeting order and (i) skipping the targeting of faults that have already been detected by previously processed simulation results; (ii) canceling attempts to target faults that have already been detected by previously processed fault simulation results; and (iii) discarding fault targeting results from targeting faults that have already been detected by previously processed fault simulation results.

23. The method according to claim 1, wherein at least a plurality of independent algorithm portions that are performed by the one or more controlled processors target different faults in the electronic circuit.

24. The method according to claim 1, further comprising producing an electronic circuit embodying a circuit design tested by test patterns generated using circuit testing algorithms in accordance with the method of claim 1.

25. The method according to claim 1, wherein the at least one circuit testing algorithm includes a plurality of circuit testing algorithms.

26. The method according to claim 25, wherein the results for the plurality of the circuit testing algorithms are processed by the controlling processor in a predetermined order that is independent of the order in which the plurality of the circuit testing algorithms are performed.

27. A method of producing test data for testing the operation of an electronic circuit comprising:
determining independent portions of at least one circuit testing algorithm, the independent portions being portions of the at least one circuit testing algorithm that are independent from the performance of other portions of the at least one circuit testing algorithm, and wherein non-independent portions of the at least one circuit testing algorithm depend upon the results from performing at least one other portion of the at least one circuit testing algorithm and wherein the circuit testing algorithm is at least one of a test pattern generation algorithm or a fault simulation algorithm;
determining non-independent portions of the at least one circuit testing algorithm;
performing at least one of the independent portions of the at least one circuit testing algorithm non-sequentially to generate results for said at least one of the independent portions;
performing at least one of the non-independent portions of the at least one circuit testing algorithm sequentially using results from a previously performed portion to generate results for said at least one of the non-independent portions of the at least one circuit testing algorithm;
processing the results for said at least one of the independent portions with the results for the non-independent portions to determine at least one of (i) a test pattern for use in testing the electronic circuit; and (ii) fault simulation results; and
determining a basic fault targeting order, processing fault targeting results in accordance with the basic fault targeting order and (i) skipping targeting of faults that have already been detected by previously processed simulation results; (ii) canceling attempts to target faults that have already been detected by previously processed fault simulation results; and (iii) discarding fault targeting results from targeting faults that have already been detected by previously processed fault simulation results.

28. An apparatus for producing test data for testing the operation of an electronic circuit comprising:
means for determining independent portions and non-independent portions of at least one circuit testing algorithm, wherein the circuit testing algorithm is at least one of a test pattern generation algorithm or a fault simulation algorithm;
means for performing at least one of the independent portions of the at least one circuit testing algorithm non-sequentially to generate results for said at least one of the independent portions;
means for performing at least one of the non-independent portions of the at least one circuit testing algorithm sequentially using results from a previously performed portion to generate results for said at least one of the non-independent portions of the at least one circuit testing algorithm; and
means for processing the results for said at least one of the independent portions with the results for the non-independent portions to determine at least one of (i) a test pattern for use in testing the electronic circuit; and (ii) fault simulation results.

29. The apparatus of claim 28, wherein the results are processed in an order the results would be processed if the independent and non-independent portions of the at least one circuit testing algorithm were performed sequentially.

30. The apparatus of claim 28, wherein at least a plurality of the independent portions of the at least one circuit testing algorithm are performed in parallel by plural controlled processors to produce results that are provided to a controlling processor.

31. The apparatus of claim 28, wherein at least one of the non-independent portions of the at least one circuit testing algorithm is performed by the controlling processor.

32. The apparatus of claim 28, wherein at least one of the non-independent portions of the circuit testing algorithm is performed by at least one controlled processor.

33. The apparatus of claim 28, wherein processing the results comprises producing plural sets of plural test patterns, each set being generated between a respective pair of simulation calls, and wherein performing at least one of the independent portions comprises performing independent algorithm portions of circuit testing algorithms associated with a single set of plural test patterns only between each pair of simulation calls.

34. A computer-readable medium storing computer-executable instructions for causing a computer system programmed thereby to perform a method comprising:
determining independent portions and non-independent portions of at least one circuit testing algorithm, the independent portions being portions of the at least one circuit testing algorithm that are independent of results from the performance of other portions of the at least one circuit testing algorithm, and wherein the non-independent portions of the at least one circuit testing algorithm depend upon results from performing at least one other portion of the at least one circuit testing algorithm and wherein the circuit testing algorithm is at least one of a test pattern generation algorithm or a fault simulation algorithm;

performing at least one of the independent portions of the at least one circuit testing algorithm non-sequentially to generate results for said at least one of the independent portions;

performing at least one of the non-independent portions of the at least one circuit testing algorithm sequentially using results from a previously performed portion generate results for said at least one of the non-independent portions of the at least one circuit testing algorithm; and processing the results for said at least one of the independent portions with the results for the non-independent portions to determine at least one of (i) a test pattern for use in testing the electronic circuit; and (ii) fault simulation results.

35. The computer-readable medium of claim 34, wherein the results are processed in an order the results would be processed if the independent and non-independent portions of the at least one circuit testing algorithm were performed sequentially.

36. The computer-readable medium of claim 34, wherein at least a plurality of the independent portions of the at least one circuit testing algorithm are performed in parallel by plural controlled processors to produce results that are provided to a controlling processor.

37. The computer-readable medium of claim 34, wherein at least one of the non-independent portions of the at least one circuit testing algorithm is performed by the controlling processor.

38. The computer-readable medium of claim 34, wherein at least one of the non-independent portions of the circuit testing algorithm is performed by at least one controlled processor.

39. The computer-readable medium of claim 34, wherein processing the results comprises producing plural sets of plural test patterns, each set being generated between a respective pair of simulation calls, and wherein performing at least one of the independent portions comprises performing independent algorithm portions of circuit testing algorithms associated with a single set of plural test patterns only between each pair of simulation calls.

* * * * *